(12) United States Patent
Lee et al.

(10) Patent No.: US 12,038,475 B2
(45) Date of Patent: Jul. 16, 2024

(54) TOUCH TESTING APPARATUS FOR TOUCH DETECTION MODULE AND METHOD FOR TESTING THE SAME

(71) Applicant: SAMSUNG DISPLAY CO., LTD., Yongin-si (KR)

(72) Inventors: Jun Seong Lee, Hwaseong-si (KR); Jun Young Ko, Seoul (KR); Kee Yong Kim, Hwaseong-si (KR); Eun Sol Seo, Yongin-si (KR); Jung Hun Sin, Seoul (KR); Jae Woo Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 269 days.

(21) Appl. No.: 17/718,846

(22) Filed: Apr. 12, 2022

(65) Prior Publication Data
US 2023/0035999 A1 Feb. 2, 2023

(30) Foreign Application Priority Data
Aug. 2, 2021 (KR) .......................... 10-2021-0101323

(51) Int. Cl.
*G01R 31/28* (2006.01)

(52) U.S. Cl.
CPC ................ *G01R 31/2891* (2013.01)

(58) Field of Classification Search
CPC ... G01R 31/28; G01R 31/2891; G06F 3/0416; G06F 3/044; G06F 2203/04103
USPC ...................................... 324/750.22
See application file for complete search history.

(56) References Cited

U.S. PATENT DOCUMENTS

| 10,310,653 | B2 | 6/2019 | Kim et al. |
| 11,237,688 | B2 | 2/2022 | Shim et al. |
| 11,409,395 | B2 | 8/2022 | Lee et al. |
| 2020/0192524 | A1* | 6/2020 | Lee .......................... G06F 3/044 |
| 2020/0256918 | A1* | 8/2020 | Chiu .................. G01R 31/2896 |

FOREIGN PATENT DOCUMENTS

| KR | 10-2011-0104349 | 9/2011 |
| KR | 10-2014-0065127 | 5/2014 |
| KR | 10-2016-0094552 | 8/2016 |

(Continued)

OTHER PUBLICATIONS

PCT International Search Report and Written Opinion issued in corresponding application No. PCT/KR2022/009502 on Oct. 19, 2022.

*Primary Examiner* — Alexander Satanovsky
*Assistant Examiner* — Courtney G McDonnough
(74) *Attorney, Agent, or Firm* — F. Chau & Associates, LLC

(57) ABSTRACT

A touch testing apparatus includes: a pogo pad area including input and output test pogo pads respectively connected to input and output test pads disposed in a pad area of a touch detection module; a test touch driver circuit configured to detect compression deviations between the input test pad and the input test pogo pad and between the output test pad and the output test pogo pad, and to correct touch data of the touch detection module based on the detected compression deviations; and a test board on which the test touch driver circuit is mounted, wherein the test board is configured to electrically connect the test touch driver circuit with the input and output test pogo pads.

27 Claims, 17 Drawing Sheets

(56) References Cited

FOREIGN PATENT DOCUMENTS

| KR | 10-2017-0112499 | 10/2017 |
| KR | 10-2018-0061883 | 6/2018 |
| KR | 10-2020-0073342 | 6/2020 |
| KR | 10-2020-0107500 | 9/2020 |
| KR | 10-2020-0110574 | 9/2020 |

* cited by examiner

FIG. 10

| 140 | 375 | 1645 | 1806 | 1505 | 239 | 168 |
|-----|------|------|------|------|------|------|
| 240 | 575 | 2645 | 2806 | 2505 | 539 | 268 |
| 590 | 3497 | 4300 | 4245 | 4232 | 3550 | 733 |
| 2334 | 4139 | 4111 | 4101 | 4086 | 4045 | 2457 |
| 2633 | 4020 | 4011 | 4046 | 4065 | 4045 | 2924 |
| 2552 | 4232 | 4148 | 4158 | 4161 | 4131 | 2314 |
| 240 | 575 | 2645 | 2806 | 2505 | 539 | 268 |
| 140 | 375 | 1645 | 1806 | 1505 | 239 | 168 |

FIG. 11

| CHANGE IN AMOUNT OF CURRENT | COMPRESSION DEVIATION RESISTANCE |
|---|---|
| -1mA | 10Ω |
| -5mA | 100Ω |
| -10mA | 300Ω |
| -15mA | 500Ω |
| -20mA | 1kΩ |
| -30mA | 2kΩ |

FIG. 12

| 200 | 200 | 200 | 200 | 200 | 200 | 200 |
|-----|-----|-----|-----|-----|-----|-----|
| 200 | 200 | 200 | 200 | 200 | 200 | 200 |
| 200 | 200 | 200 | 200 | 200 | 200 | 200 |
| 200 | 200 | 200 | 200 | 200 | 200 | 200 |
| 200 | 200 | 200 | 200 | 200 | 200 | 200 |
| 200 | 200 | 200 | 200 | 200 | 200 | 200 |
| 200 | 200 | 200 | 200 | 200 | 200 | 200 |
| 200 | 200 | 200 | 200 | 200 | 200 | 200 |

FIG. 13

| 340 | 575 | 1845 | 2006 | 1705 | 439 | 368 |
|-----|-----|------|------|------|-----|-----|
| 440 | 775 | 2845 | 3006 | 2705 | 739 | 468 |
| 790 | 3697 | 4500 | 4445 | 4432 | 3750 | 933 |
| 2534 | 4339 | 4311 | 4301 | 4286 | 4245 | 2657 |
| 2833 | 4220 | 4211 | 4246 | 4265 | 4245 | 3124 |
| 2752 | 4432 | 4348 | 4358 | 4361 | 4331 | 2514 |
| 440 | 775 | 2845 | 3006 | 2705 | 739 | 568 |
| 340 | 575 | 1845 | 2006 | 1705 | 439 | 368 |

FIG. 17

| 380 | 908 | 3106 | 3046 | 3201 |
|---|---|---|---|---|
| 890 | 3997 | 4800 | 4545 | 4806 |
| 3034 | 4539 | 4611 | 4801 | 4986 |
| 3633 | 4520 | 4711 | 4846 | 4365 |
| 3252 | 4532 | 4648 | 4558 | 4361 |
| 804 | 1508 | 2845 | 1806 | 1205 |

ETA1_Data

| 240 | 575 | 2645 | 2806 | 2505 |
|---|---|---|---|---|
| 590 | 3497 | 4300 | 4245 | 4232 |
| 2334 | 4139 | 4211 | 4101 | 4086 |
| 2633 | 4020 | 4211 | 4146 | 4065 |
| 2552 | 4232 | 4248 | 4158 | 4161 |
| 504 | 1008 | 2045 | 1006 | 805 |

ETA2_Data

FIG. 18

| 200 | 200 | 200 | 200 | 200 |
|---|---|---|---|---|
| 200 | 200 | 200 | 200 | 200 |
| 200 | 200 | 200 | 200 | 200 |
| 200 | 200 | 200 | 200 | 200 |
| 200 | 200 | 200 | 200 | 200 |
| 200 | 200 | 200 | 200 | 200 |

1_BData

| 300 | 300 | 300 | 300 | 300 |
|---|---|---|---|---|
| 300 | 300 | 300 | 300 | 300 |
| 300 | 300 | 300 | 300 | 300 |
| 300 | 300 | 300 | 300 | 300 |
| 300 | 300 | 300 | 300 | 300 |
| 300 | 300 | 300 | 300 | 300 |

2_BData

FIG. 19

| 400 | 1108 | 3306 | 3246 | 3401 |
|---|---|---|---|---|
| 1090 | 4197 | 5000 | 4745 | 5106 |
| 3234 | 4739 | 4811 | 5001 | 5186 |
| 3833 | 4720 | 4911 | 5046 | 4565 |
| 3452 | 4732 | 4848 | 4758 | 4561 |
| 1006 | 1708 | 3045 | 2006 | 1405 |

1_TData

| 540 | 875 | 29475 | 3106 | 2805 |
|---|---|---|---|---|
| 390 | 3797 | 4600 | 4545 | 4332 |
| 2634 | 4439 | 4511 | 4401 | 4386 |
| 2933 | 4320 | 4511 | 4446 | 4365 |
| 4352 | 4532 | 4548 | 4458 | 4461 |
| 804 | 1308 | 2345 | 1306 | 1105 |

2_TData

TOUCH TESTING APPARATUS FOR TOUCH DETECTION MODULE AND METHOD FOR TESTING THE SAME

CROSS-REFERENCE TO RELATED APPLICATION

This application claims priority under 35 U.S.C. § 119 to Korean Patent Application No. 10-2021-0101323 filed on Aug. 2, 2021 in the Korean Intellectual Property Office, the disclosure of which is incorporated by reference herein in its entirety.

TECHNICAL FIELD

The present invention relates to a touch testing apparatus for a touch detection module, and a method for testing the same.

DISCUSSION OF THE RELATED ART

As the information-oriented society evolves, various desires for display devices increases. For example, display devices are being employed by a variety of electronic devices such as smart phones, digital cameras, laptop computers, navigation devices, and smart televisions.

Typically, a display device includes a touch module as an input interface to detect a user's touch. A touch module, generally, includes a touch detecting unit, in which touch electrodes are arranged, and a touch driver circuit that detects the amount of charge stored in the capacitance between the touch electrodes.

The touch driver circuit of the touch module may be mounted on, for example, a flexible film and may be electrically connected to the touch electrodes of the touch detecting unit through the flexible film. The touch module, in which the touch driver circuit is mounted on the flexible film, may be mass-produced. In addition, to allow a separate touch driver circuit to be connected from the outside, the touch module, in which only a flexible film is connected to the touch detecting unit, may be mass-produced.

In such case, it is desirable to test the quality of the touch detecting unit using a separate testing apparatus.

SUMMARY

To test the touch detecting performance of a touch detecting unit connected to a flexible film, a pogo pad area of the testing apparatus may be brought into contact with the pad area of the flexible film and may be compressed. Then, touch driving signals are supplied, and touch signals are separately detected and tested.

Unfortunately, compression deviations may occur between the touch pads disposed on the pad area of the flexible film and the pogo pads (or, e.g., pogo pins) of the pogo pad area, and thus, the test results may not be accurately derived. For example, if a defect is detected, it may be difficult to accurately identify the cause of the defect whether it is an error due to touch data or a communication error due to compression deviations.

The present invention provides a touch testing apparatus that can increase test performance and accuracy of mass-produced touch detecting modules in which a touch detecting unit and a flexible film are connected without a touch driver circuit, and a method for testing the same.

The present invention also provides a touch testing apparatus that can accurately derive the cause of a defect by detecting and compensating for compression deviations between the touch pads of the pad area and the pogo pads of the pogo pad area, and a method for testing the same.

According to an embodiment of the present invention, a touch testing apparatus includes: a pogo pad area including input and output test pogo pads respectively connected to input and output test pads disposed in a pad area of a touch detection module; a test touch driver circuit configured to detect compression deviations between the input test pad and the input test pogo pad and between the output test pad and the output test pogo pad, and to correct touch data of the touch detection module based on the detected compression deviations; and a test board on which the test touch driver circuit is mounted, wherein the test board is configured to electrically connect the test touch driver circuit with the input and output test pogo pads.

In an embodiment of the present invention, the pogo pad area includes: a display pogo area corresponding to a display pad area of the pad area; a first touch pogo area corresponding to a first touch pad area of the pad area; a second touch pogo area corresponding to a second touch pad area of the pad area; a first input pogo area corresponding to a first test pad area of the pad area; and a first output pogo area corresponding to a second test pad area of the pad area.

In an embodiment of the present invention, the display pogo area includes display pogo pads connected to display pads disposed in the display pad area, respectively, wherein the first touch pogo area includes first touch pogo pads in contact with first touch pads disposed in the first touch pad area, respectively, wherein the second touch pogo area includes second touch pogo pads connected to second touch pads disposed in the second touch pad area, wherein the first input pogo area includes a first input test pogo pad connected to a first input test pad disposed in the first test pad area, and wherein the first output pogo area includes a first output test pogo pad connected to a first output test pad disposed in the second test pad area.

In an embodiment of the present invention, the test touch driver circuit is electrically connected to the display pads, the first and second touch pads, and the first input test and first output test pads of the pad area through the display pogo pads, the first and second touch pogo pads, and the first input and first output test pogo pads.

In an embodiment of the present invention, the test touch driver circuit is configured to supply a touch driving signal to the first touch pads and driving electrodes of the touch detection module through the first touch pogo pads, and to supply a test signal to the first input test pad, a test signal transmission line, and the first output test pad disposed on the touch detection module through the first input test pogo pad.

In an embodiment of the present invention, the test touch driver circuit is configured to generate the touch data by measuring a charge in an amount of charges stored in each of touch nodes of the touch detection module through the second touch pogo pads, to detect compression deviations between the first input test pad and the first input test pogo pad and between the first output test pad and the first output test pogo pads according to a change in an amount of current of the test signal input through the first output test pogo pad, and to correct the touch data by using compensation data corresponding to the detected compression deviations.

In an embodiment of the present invention, the test touch driver circuit includes: a driving signal output circuit configured to supply a touch driving signal to the first touch pads through the first touch pogo pads, and to supply a test signal to the first input test pad through the first input test pogo pad; a sensing circuit configured to sense a charge in an amount of charges stored in each of touch nodes of the touch detection module through the second touch pogo pads and to detect the test signal through the first output test pogo pad; an analog-to-digital converter configured to convert a sensing voltage, which is according to a change in an amount of charges output from the sensing circuit, into digital data to generate the touch data; a current detector configured to detect an amount of current of the test signal received from the sensing circuit; a compression deviation detector configured to calculate a resistance value according to a difference in current values by comparing a predetermined reference current value with the amount of detected current value of the test signal; a compensation data storage configured to output compensation data corresponding to the resistance value; and a data compensator configured to correct the touch data by calculating the touch data with the compensation data.

In an embodiment of the present invention, the display pogo area includes display pogo pads connected to the display pads disposed in the display pad area, respectively, wherein the first touch pogo area includes first touch pogo pads and second touch pogo pads, wherein the first touch pogo pads are connected to first touch pads of the first touch pad area, wherein the second touch pogo pads are connected to second touch pads, wherein the second touch pogo area includes first touch pogo pads and second touch pogo pads, wherein the first touch pogo pads are connected to the first touch pads of the second touch pad area, wherein the second touch pogo pads are connected to the second touch pads, wherein the first input pogo area includes a first input test pogo pad connected to a first input test pad disposed in the first test pad area, and wherein the first output pogo area includes a first output test pogo pad connected to a first output test pad disposed in the second test pad area.

In an embodiment of the present invention, the test touch driver circuit is configured to supply a touch driving signal to the first touch pads and driving electrodes of the touch detection module through the first touch pogo pads separately disposed in the first and second touch pogo areas, and is configured to supply a test signal to the first input test pad, a test signal transmission line and the first output test pad of the touch detection module through the first input test pogo pad.

In an embodiment of the present invention, the test touch driver circuit is configured to sense and amplify changes in amounts of charges stored in touch nodes that are output separately from the second touch pogo pads of the first touch pogo area and the second touch pogo pads of the second touch pogo area, and to sort sensing voltages according to the changes in the amounts of charges into the first and second touch pogo areas and to convert them into touch data for the first and second touch pogo areas separately.

In an embodiment of the present invention, the test touch driver circuit is configured to compare an amount of detected current according to the test signal of the first input test pogo pad with a reference current value, to compare an amount of detected current according to the test signal of the first output test pogo pad with the reference current value, to calculate first and second compensation data based on first and second resistance values according to a difference in the compared current values, and to correct the touch data for the different first and second areas by calculating the first and second compensation data on the touch data of the first and second areas divided into the first and second touch pogo areas separately.

In an embodiment of the present invention, the first input pogo area includes first and second input test pogo pads respectively connected to first and second input test pads disposed in the first test pad area, and wherein the first output pogo area includes first and second output test pogo pads respectively connected to first and second output test pads disposed in the second test pad area.

In an embodiment of the present invention, the test touch driver circuit is configured to supply a test signal to the first and second input test pads and first and second test signal transmission lines of the touch detection module through the first and second input test pogo pads, and to detect compression deviations between the first input test pad and the first input test pogo pad and between the second input test pad and the second input test pogo pad, and compression deviations between the first output test pad and the first output test pogo pad and between the second output test pad and the second output test pogo pad according to a change in an amount of current of the test signal input to the first and second output test pogo pads.

In an embodiment of the present invention, the first input pogo area includes a first input test pogo pad and a first output test pogo pad connected to a first input test pad and a first output test pad disposed in the first test pad area, respectively, and wherein the first output pogo area includes a second input test pogo pad and a second output test pogo pad connected to a second input test pad and a second output test pad disposed in the second test pad area, respectively.

In an embodiment of the present invention, the test touch driver circuit is configured to supply a test signal to the first and second input test pads and first and second test signal transmission lines through first and second input test pogo pads separately disposed in the first input and first output pogo areas, respectively, and to detect compression deviations between the first input test pad and the first input test pogo pad and compression deviations between the second input test pad and the second input test pogo pad according to a change in an amount of current of the test signal respectively input to the first and second output test pogo pads separately disposed in the first input and first output pogo areas, respectively.

According to an embodiment of the present invention, a method for testing a touch detection module includes: connecting first input and first output test pogo pads included in a pogo pad area with first input and first output test pads disposed in a pad area of a touch detection module, respectively; supplying a test signal to the first input test pad and a first test signal transmission line of the touch detection module through the first input test pogo pad, wherein the first test signal transmission line is connected to the first input test pad; detecting compression deviations between the first input test pad and the first input test pogo pad and between the first output test pad and the first output test pogo pad based on a change in an amount of current of the test signal output through the first output test pogo pad; and correcting touch data of the touch detection module using compensation data items corresponding to the detected compression deviations.

In an embodiment of the present invention, the connecting the first input and first output test pogo pads with the first input and first output test pads, respectively, includes: connecting display pogo pads disposed in a display pogo area of the pogo pad area with display pads disposed in a display pad area of the pad area; connecting first touch pogo pads disposed in a first touch pogo area of the pogo pad area with first touch pads disposed in a first touch pad area of the pad area; connecting second touch pogo pads disposed in a second touch pogo area of the pogo pad area with second touch pads disposed in a second touch pad area of the pad area; connecting the first input test pogo pad disposed in a first input pogo area of the pogo pad area with the first input test pad disposed in a first test pad area of the pad area; and connecting the first output test pogo pad disposed in a first output pogo area of the pogo pad area with the first output test pad disposed in a second test pad area of the pad area.

In an embodiment of the present invention, the correcting touch data of the touch detection module includes: measuring a change in an amount of charges stored in each of touch nodes of the touch detection module through the second touch pogo pads to generate touch data items according to the change in the amount of charges stored in each of the touch nodes; detecting compression deviations between the first input test pad and the first input test pogo pad and between the first output test pad and the first output test pogo pad according to a change in an amount of current of the test signal output to the first output test pogo pad; and correcting the touch data items by calculating the touch data and the compensation data items corresponding to the detected compression deviations.

In an embodiment of the present invention, the correcting the touch data of the touch detection module includes: supplying a touch driving signal to the first touch pads through the first touch pogo pads; detecting a change in an amount of charges stored in each of touch nodes of the touch detection module through the second touch pogo pads to convert a sensing voltage according to the change in the amount of charges into the touch data; detecting an amount of current of the test signal by receiving the test signal through the first output test pogo pad; comparing a predetermined reference current value with an amount of detected current of the test signal to calculate a resistance value according to a difference in the current values; and compensating for the touch data by calculating the touch data and predetermined compensation data corresponding to the resistance value.

In an embodiment of the present invention, the compensation data is set to data values having a predetermined size according to predetermined experimental values, or set to a predetermined weight value or predetermined threshold value.

In an embodiment of the present invention, the correcting the touch data of the touch detection module includes correcting the touch data by adding or subtracting the compensation data to or from the touch data, or correcting the touch data by multiplying the touch data by the weight value or the threshold value.

In an embodiment of the present invention, the connecting the first input and first output test pogo pads with the first input and first output test pads, respectively, includes: connecting display pogo pads disposed in a display pogo area of the pogo pad area with display pads disposed in a display pad area of the pad area; connecting first touch pogo pads and second touch pogo pads disposed in a first touch pogo area of the pogo pad area with first touch pads and second touch pads disposed in a first touch pad area of the pad area; connecting first touch pogo pads and second touch pogo pads disposed in a second touch pogo area of the pogo pad area with first touch pads and second touch pads disposed in a second touch pad area of the pad area; connecting the first input test pogo pad disposed in a first input pogo area of the pogo pad area with the first input test pad disposed in a first test pad area of the pad area; and connecting the first output test pogo pad disposed in a first output pogo area of the pogo pad area with the first output test pad disposed in a second test pad area of the pad area.

In an embodiment of the present invention, the correcting the touch data of the touch detection module includes: detecting changes in amounts of charges stored in touch nodes that are separately output from the second touch pogo pads in the first touch pogo area and the second touch pogo pads in the second touch pogo area; converting sensing voltages according to the changes in the amounts of charges into touch data, of the first and second touch pogo areas, by sorting them into the first and second touch pogo areas; comparing each of an amount of current according to a test signal of the first input test pogo pad and an amount of detected current according to a test signal of the first output test pogo pad with a reference current value to calculate first and second compensation data based on analysis results; and calculating the first and second compensation data for the touch data for the first and second touch pogo areas, respectively, to correct the touch data for the first and second touch pogo areas.

In an embodiment of the present invention, the connecting the first input and first output test pogo pads with the first input and first output test pads, respectively, includes: connecting display pogo pads disposed in a display pogo area of the pogo pad area with display pads disposed in a display pad area of the pad area; connecting first touch pogo pads disposed in a first touch pogo area of the pogo pad area with first touch pads disposed in a first touch pad area of the pad area; connecting second touch pogo pads disposed in a second touch pogo area of the pogo pad area with second touch pads disposed in a second touch pad area of the pad area; connecting the first input test pogo pad and a second input test pogo pad disposed in a first input pogo area of the pogo pad area with the first input test pad and a second input test pad disposed in a first test pad area of the pad area; and connecting the first output test pogo pad and a second output test pogo pad disposed in a first output pogo area of the pogo pad area with the first output test pad and a second output test pad disposed in a second test pad area of the pad area.

In an embodiment of the present invention, the detecting the compression deviations between the first input test pad and the first input test pogo pad and between the first output test pad and the first output test pogo pad includes: supplying the test signal to the first and second input test pads of the touch detection module and the first test signal transmission line and a second test signal transmission line through the first and second input test pogo pads; and detecting compression deviations between the first input test pad and the first input test pogo pad and between the second input test pad the second input test pogo pad and compression deviations between the first output test pad and the first output test pogo pad and between the second output test pad and the second output test pogo pad according to a change in an amount of current of the test signal input to the first and second output test pogo pads.

In an embodiment of the present invention, the connecting the first input and first output test pogo pads with the first input and first output test pads, respectively, includes: connecting display pogo pads disposed in a display pogo area of the pogo pad area with display pads disposed in a display pad area of the pad area; connecting first touch pogo pads disposed in a first touch pogo area of the pogo pad area with first touch pads disposed in a first touch pad area of the pad area; connecting second touch pogo pads disposed in a second touch pogo area of the pogo pad area with second touch pads disposed in a second touch pad area of the pad area; connecting the first input test pogo pad and the first output test pogo pad disposed in a first input pogo area of the pogo pad area to the first input test pad and the first output test pad disposed in a first test pad area of the pad area; connecting a second input test pogo pad and a second output test pogo pad disposed in a first output pogo area of the pogo pad area to a second input test pad and a second output test pad disposed in a second test pad area of the pad area.

In an embodiment of the present invention, the detecting the compression deviations between the first input test pad and the first input test pogo pad and between the first output test pad and the first output test pogo pad includes: supplying the test signal to the first and second input test pads and the first test signal transmission line and a second test signal transmission line through first and second input test pogo pads separately disposed in the first input and first output pogo areas, respectively; and detecting compression deviations between the first input test pad and the first input test pogo pad and compression deviations between the second input test pad and the second input test pogo pad according to a change in an amount of current of the test signal respectively input to the first and second output test pogo pads separately disposed in the first input and first output pogo areas, respectively.

BRIEF DESCRIPTION OF THE DRAWINGS

The above and other features of the present invention will become more apparent by describing in detail embodiments thereof with reference to the attached drawings, in which:

FIG. 10 is a diagram illustrating an example of touch sensing data detected by the touch driver circuit of FIG. 7.

FIG. 11 is a diagram illustrating the amount of current detected through test signal output pads of FIG. 8 and the magnitude of resistance.

FIG. 12 is a diagram illustrating an example of compensation data for compensating for touch sensing data according to compression deviations.

FIG. 13 is a diagram illustrating an example of touch sensing data which was compensated by modulating it with the compensation data.

FIG. 17 is a diagram illustrating an example of touch sensing data detected by the touch detection module and the test touch driver circuit of FIG. 14.

FIG. 18 is a diagram illustrating an example of compensation data for compensating for touch sensing data according to compression deviations.

FIG. 19 is a diagram illustrating an example of touch sensing data which was compensated by modulating it with the compensation data.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as being limited to the embodiments set forth herein.

It will also be understood that when a layer is referred to as being "on" another layer or substrate, it can be directly on the other layer or substrate, or intervening layers may also be present. The same reference numbers may indicate the same components throughout the specification, and thus, repetitive descriptions may be omitted.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present invention. Similarly, the second element could also be termed the first element.

Each of the features of the various embodiments of the present invention may be combined or combined with each other, in part or in whole, and technically, various interlocking and driving are possible. Each embodiment may be implemented independently of each other or may be implemented together in an association.

Hereinafter, embodiments of the present invention will be described in detail with reference to the accompanying drawings.

Figure 1:
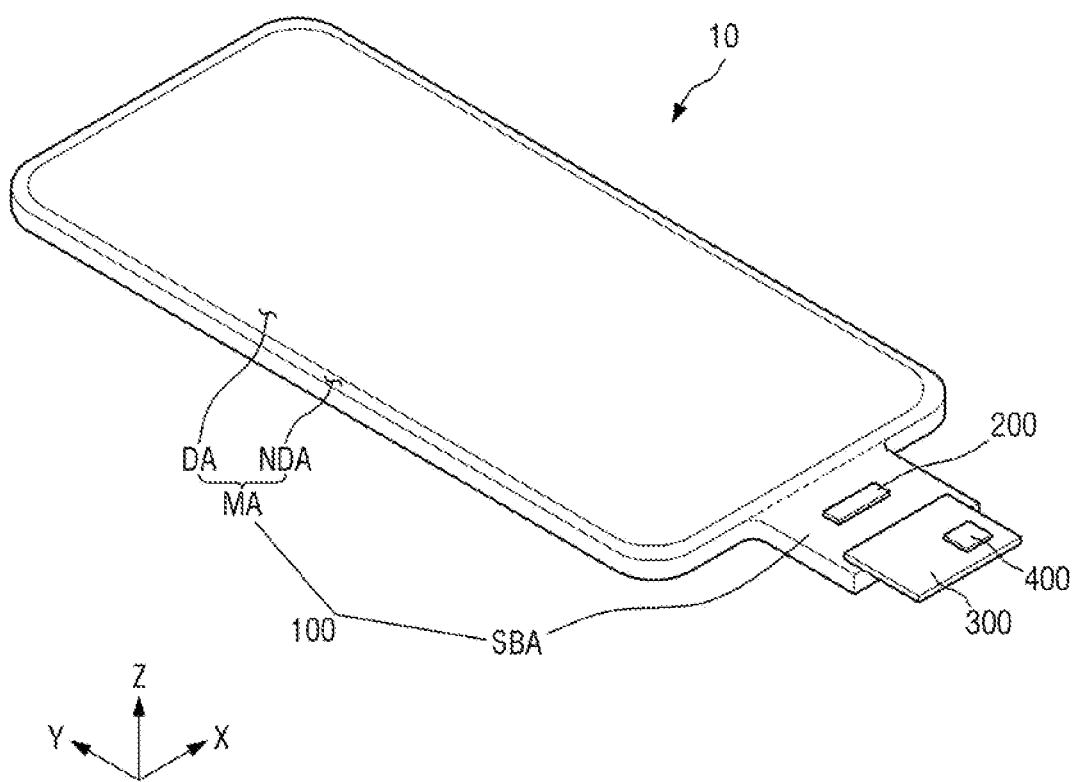
FIG. 1 is a perspective view of a display device according to an embodiment of the present invention.
Figure 2:
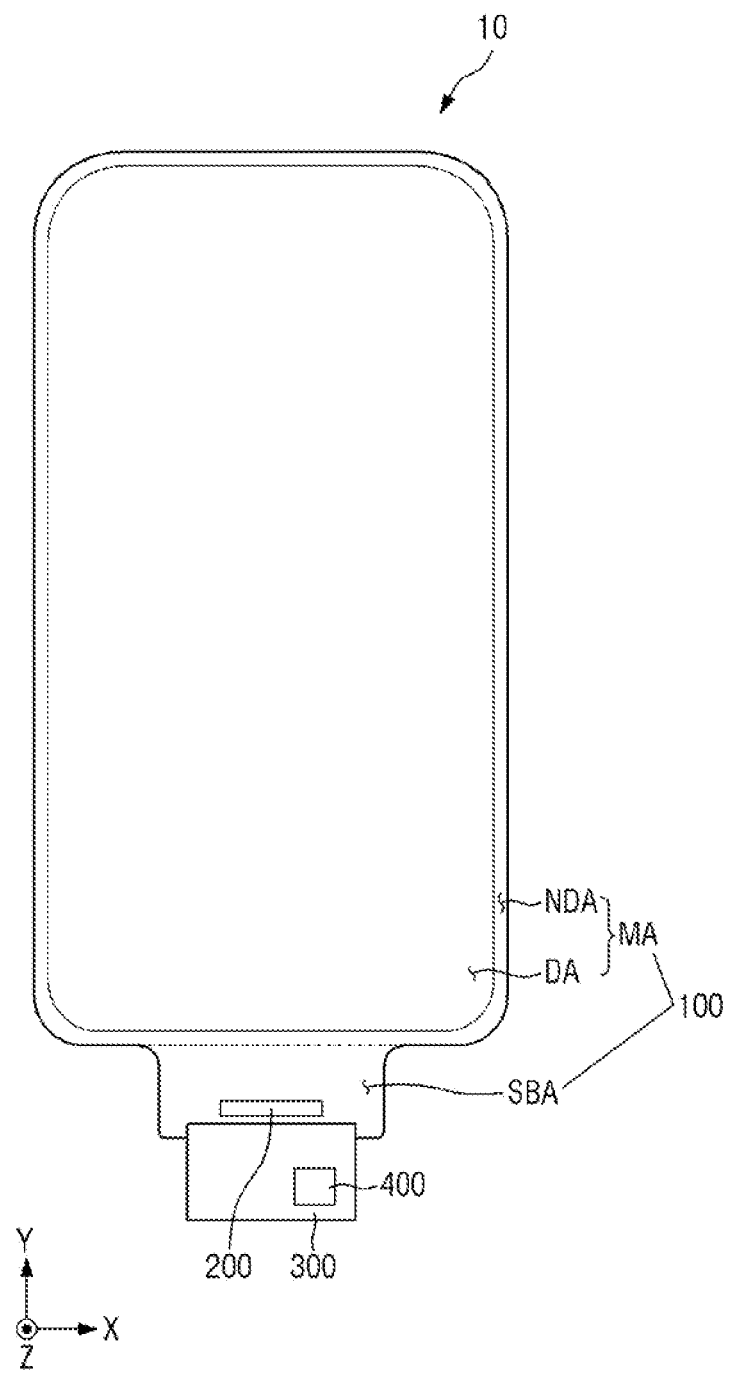
FIG. 2 is a plan view illustrating a display device according to an embodiment of the present invention.
Figure 3:
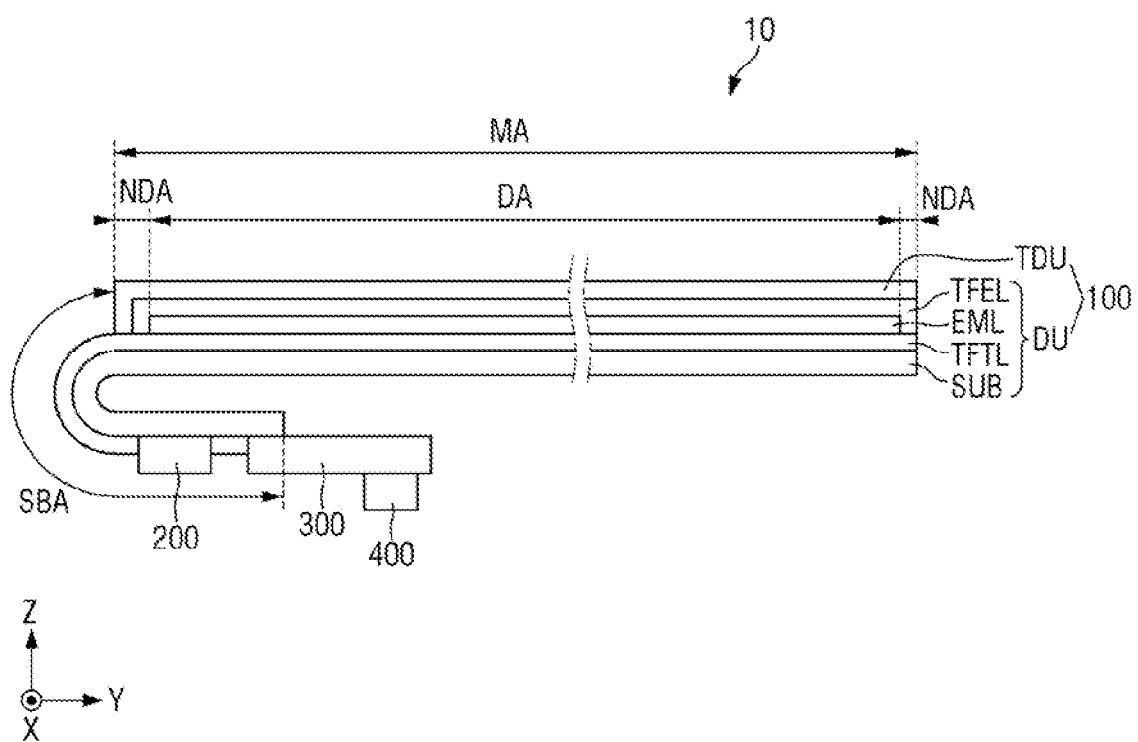
FIG. 3 is a side view illustrating a display device according to an embodiment of the present invention.

FIG. 1 is a perspective view of a display device according to an embodiment of the present invention. FIG. 2 is a plan view illustrating a display device according to an embodiment of the present invention. FIG. 3 is a side view illustrating a display device according to an embodiment of the present invention.

Referring to FIGS. 1 to 3, a display device 10 according to an embodiment of the present invention may be employed by portable electronic devices such as a mobile phone, a smart phone, a tablet personal computer (PC), a mobile communications terminal, an electronic notebook, an electronic book, a portable multimedia player (PMP), a navigation device and an ultra mobile PC (UMPC). In addition, the display device 10 according to an embodiment of the present invention may be used as a display unit of a television, a laptop computer, a monitor, an electronic billboard, or the Internet of Things (IOT). In addition, the display device 10 according to the embodiment of the present invention may be applied to wearable devices such as a smart watch, a watch phone, a glasses-type display, and a head-mounted display (HMD) device. In addition, the display device 10 according to the present embodiment may be used as a center information display (CID) disposed at the instrument cluster, the center fascia or the dashboard of a vehicle, as a room mirror display on the behalf of the side mirrors of a vehicle, as a display placed on the back of each of the front seats that is an entertainment system for passengers at the rear seats of a vehicle.

According to an embodiment of the present invention, the display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and an ultra-small light-emitting display device using micro or nano light-emitting diodes (micro LEDs or nano LEDs). In the following description, an organic light-emitting display device is described as an example of the display device 10 according to the embodiment of the present invention. It is, however, to be understood that the present invention is not limited thereto.

According to the embodiment of the present invention, the display device 10 includes a display panel 100, a display driver circuit 200, a display circuit board 300 and a touch driver circuit 400.

The display panel 100 may be formed with a rectangular shape having shorter sides in a first direction (e.g., an x-axis direction) and longer sides in a second direction (e.g., a y-axis direction) intersecting the first direction (e.g., the x-axis direction). For example, each of the corners where the short side in the first direction (x-axis direction) meets the longer side in the second direction (e.g., the y-axis direction) may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be formed flat, but is not limited thereto. For example, the display panel 100 includes curved portions formed at left and right ends and having a constant curvature or a varying curvature. In addition, the display panel 100 may be formed to be flexible so that it can be curved, bent, folded or rolled.

The display panel 100 includes a main area MA and a subsidiary area SBA.

The main area MA includes a display area DA where images are displayed, and a non-display area NDA around the display area DA. The display area DA includes pixels for displaying images. The subsidiary area SBA may protrude from one side of the main area MA. For example, the subsidiary area SBA may protrude in the second direction (y-axis direction).

Although the subsidiary area SBA is unfolded in the example shown in FIGS. 1 and 2, the subsidiary area SBA may be bent as shown in FIG. 3 and may be disposed on the lower surface of the display panel 100. When the subsidiary area SBA is bent, it may overlap the main area MA in the third direction (e.g., a z-axis direction), which is the thickness direction of the substrate SUB. The display driver circuit 200 may be disposed in the subsidiary area SBA.

In addition, as shown in FIG. 3, the display panel 100 includes a substrate SUB, a thin-film transistor layer TFTL, an emission material layer EML, an encapsulation layer TFEL, and a touch detecting unit TDU.

The thin-film transistor layer TFTL may be disposed on the substrate SUB. The thin-film transistor layer TFTL may be disposed in the main area MA and the subsidiary area SBA. The thin-film transistor layer TFTL includes thin-film transistors.

The emission material layer EML may be disposed on the thin-film transistor layer TFTL. The emission material layer EML may be disposed in the display area DA of the main area MA. The emission material layer EML includes light-emitting elements disposed in emission areas.

The encapsulation layer TFEL may be disposed on the emission material layer EML. The encapsulation layer TFEL may be disposed in the display area DA and the non-display area NDA of the main area MA. The encapsulation layer TFEL includes at least one inorganic layer and at least one organic layer for encapsulating the emission material layer.

The touch detecting unit TDU may be disposed on the encapsulation layer TFEL. The touch detecting unit TDU may be disposed in the display area DA and the non-display area NDA of the main area MA. The touch detecting unit TDU may sense a touch of a person or an object using sensor electrodes.

A cover window may protect the display panel 100 and may be disposed on the touch detecting unit TDU. The cover window may be attached on the touch detecting unit TDU by a transparent adhesive member such as an optically clear adhesive (OCA) layer and an optically clear resin (OCR). The cover window may be an inorganic material such as glass, or an organic material such as plastic and polymer material. To prevent deterioration of image visibility due to reflection of external light, a polarizing film may be disposed between the touch detecting unit TDU and the cover window.

The display driver circuit 200 may generate signals and voltages for driving the display panel 100. The display driver circuit 200 may be implemented as an integrated circuit (IC) and may be attached to the display panel 100 by, for example, a chip on glass (COG) technique, a chip on plastic (COP) technique, or an ultrasonic bonding. It is, however, to be understood that the present invention is not limited thereto. For example, the display driver circuit 200 may be attached on the display circuit board 300 by the chip-on-film (COF) technique.

The display circuit board 300 may be attached to one end of the subsidiary area SBA of the display panel 100. Accordingly, the display circuit board 300 may be electrically connected to the display panel 100 and the display driver circuit 200. The display panel 100 and the display driver circuit 200 may receive digital video data, timing signals, and driving voltages through the display circuit board 300. The display circuit board 300 may be a flexible printed circuit board, a printed circuit board, or a flexible film such as a chip-on film.

The touch driver circuit 400 may be disposed on the display circuit board 300. The touch driver circuit 400 may be implemented as an integrated circuit (IC) and may be attached on the display circuit board 300.

The touch driver circuit 400 may be electrically connected to the touch electrodes of the touch detecting unit TDU. The touch driver circuit 400 applies touch driving signals to the touch electrodes of the touch detecting unit TDU, and measures a change in the amount of charges stored in the mutual capacitance of each of the plurality of touch nodes formed by the touch electrodes. The touch driver circuit 400 may determine whether there is a user's touch or near proximity, based on the amount of a change in the mutual capacitance of each of the plurality of touch nodes. For example, a user's touch may refer to an object such as the user's finger or a pen brought into contact with a surface of the cover window disposed on the touch detecting unit TDU. For example, a user's near proximity refers to an object such as the user's finger and a pen hovering over a surface of the cover window.

As shown in FIGS. 1 to 3, to reduce reflection of external light by metal lines and metal electrodes of the display panel 100, the display panel 100 may include a color filter layer CFL including color filters. Accordingly, since it is not necessary to attach a separate anti-reflection member such as a polarizing plate on the display panel 100, the fabrication cost of the display device 10 can be saved.

Figure 4:
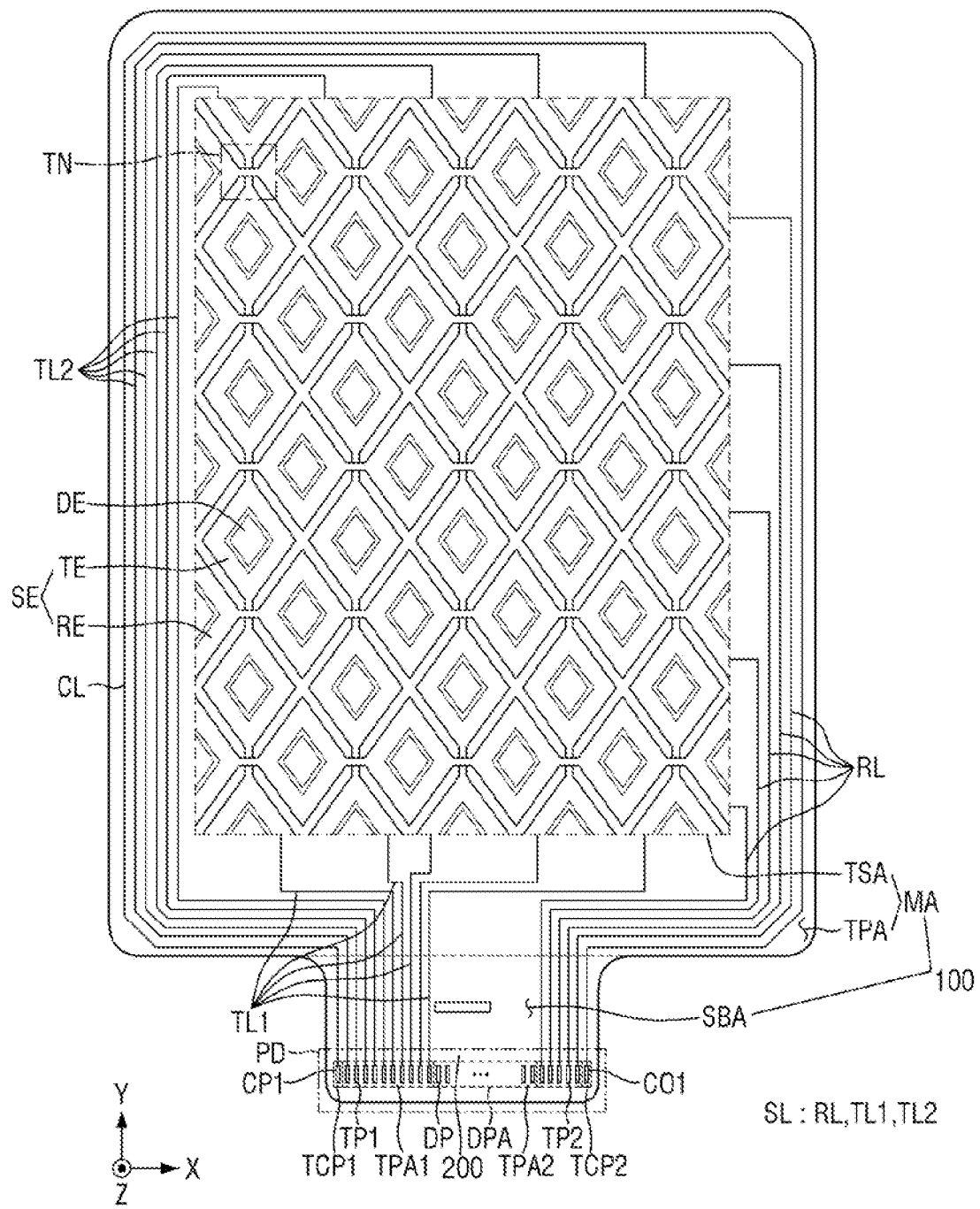
FIG. 4 is a view illustrating a layout of the touch detection module shown in FIGS. 1 to 3.

FIG. 4 is a view illustrating an example of a layout of the touch detection module shown in FIGS. 1 to 3.

In the example shown in FIG. 4, the touch electrodes SE of the main area MA include two kinds of electrodes, e.g., the driving electrodes TE and the sensing electrodes RE. The mutual capacitive sensing is carried out by applying touch driving signals to the driving electrode TE, and then sensing a change in the amount of charges stored in the mutual capacitance of each of the touch nodes through the sensing electrodes RE. It is, however, to be understood that the present invention is not limited thereto.

For convenience of illustration, FIG. 4 shows the driving electrodes TE, the sensing electrodes RE, the dummy patterns DE, the touch lines TL1, TL2 and RL, a test signal transmission line CL, first and second touch pads TP1 and TP2, and first input and first output test pads CP1 and CO1.

Referring to FIG. 4, the main area MA of the touch detecting unit TDU includes a touch sensing area TSA for sensing a user's touch, and a touch peripheral area TPA disposed around the touch sensing area TSA. The touch sensing area TSA may overlap the display area DA of FIGS. 1 to 3, and the touch peripheral area TPA may overlap the non-display area NDA.

The driving electrodes TE, the sensing electrodes RE and the dummy patterns DE are disposed in the touch sensing area TSA. The driving electrodes TE and the sensing electrodes RE may be electrodes for forming mutual capacitance to sense a touch of an object or a person.

The sensing electrodes RE may be arranged in the first direction (e.g., the x-axis direction) and second direction (e.g., the y-axis direction). The sensing electrodes RE may be electrically connected to one another in the first direction (e.g., the x-axis direction). The sensing electrodes RE may be connected to one another in the first direction (e.g., the x-axis direction). The sensing electrodes RE adjacent to one another in the second direction (e.g., the y-axis direction) may be electrically separated from one another. Accordingly, touch nodes TN where mutual capacitance is formed may be disposed at intersections of the driving electrodes TE and the sensing electrodes RE. A plurality of touch nodes TN may correspond with the intersections of the driving electrodes TE and the sensing electrodes RE, respectively.

The driving electrodes TE may be arranged in the first direction (e.g., the x-axis direction) and second direction (e.g., the y-axis direction). The driving electrodes TE adjacent to one another in the first direction (e.g., the x-axis direction) may be electrically separated from one another. The driving electrodes TE may be electrically connected to one another in the second direction (e.g., the y-axis direction). The driving electrodes TE adjacent to one another in the second direction (e.g., the y-axis direction) may be connected to each other. For example, the driving electrodes TE adjacent to one another in the second direction (e.g., the y-axis direction) may be connected to each other through separated connection electrodes.

Each of the dummy patterns DE may be surrounded by the driving electrode TE and/or the sensing electrode RE. Each of the dummy patterns DE may be electrically separated from the driving electrode TE and/or the sensing electrode RE. Each of the dummy patterns DE may be spaced apart from the driving electrode TE and/or the sensing electrode RE. Each of the dummy patterns DE may be electrically floating.

In FIG. 4, for example, the driving electrodes TE, the sensing electrodes RE and the dummy patterns DE each have a diamond shape when viewed from the top, but the present invention is not limited thereto. For example, each of the driving electrodes TE, the sensing electrodes RE and the dummy patterns DE may have a quadrangular shape, a polygonal shape, a circular or an elliptical shape when viewed from the top.

The touch lines TL1, TL2 and RL and the test signal transmission line CL may be disposed in the touch peripheral area TPA. The touch lines TL1, TL2 and RL include first touch driving lines TL1 and second touch driving lines TL2 connected to the driving electrodes TE, and touch sensing lines RL connected to the sensing electrodes RE.

The sensing electrodes RE disposed on one side of the touch sensor area TSA may be connected to the touch sensing lines RL, respectively. For example, some of the sensing electrodes RE that are disposed at the right side of the touch sensing area TSA may be connected to the sensing lines RL, respectively, as shown in FIG. 4. The touch sensing lines RL may be connected to second touch pads TP2 disposed on a pad area PD, respectively.

The driving electrodes TE disposed at one end of the touch sensor area TSA may be connected to the first driving lines TL1, respectively, while the driving electrodes TE disposed at the opposite end of the touch sensor area TSA may be connected to the second driving lines TL2, respectively. For example, the driving electrodes TE that are disposed at the lower end (or, e.g., side) of the touch sensor area TSA may be connected to the first touch driving lines TL1, respectively, while the driving electrodes TE disposed at the upper end (or, e.g., side) may be connected to the second touch driving lines TL2, respectively. The second touch driving lines TL2 may be extended around the left side of the touch sensing area TSA and may be connected to the driving electrodes TE at the upper side of the touch sensing area TSA.

The first touch driving lines TL1 and the second touch driving lines TL2 may be connected to first touch pads TP1 disposed in the pad area PD, respectively. The driving electrodes TE are connected to the first and second touch driving lines TL1 and TL2 on the two sides of the touch sensing area TSA to receive touch driving signals. Accordingly, it is possible to prevent a difference between the touch driving signals applied to the driving electrodes TE disposed on the lower side of touch sensing area TSA and the touch driving signals applied to the driving electrodes TE disposed on the upper side of the touch sensing area TSA due to a RC delay of the touch driving signals.

The test signal transmission line CL may be disposed in the touch peripheral area TPA. For example, the test signal transmission line CL may be disposed adjacent to the outer side of the touch peripheral area TPA such that it surrounds all of the touch detecting unit TDU, the first and second touch driving lines TL1 and TL2, and the touch sensing lines RL. One end of the test signal transmission line CL is connected to a first input test pad CP1 disposed at one end of the pad area PD, while the other end of the test signal transmission line CL is connected to a first output test pad CO1 disposed at the other end of the pad area PD.

The first input and first output test pads CP1 and CO1 and the test signal transmission line CL are elements that receive a test signal when the touch detection module is tested. During the touch driving test, pogo pads (or, e.g., pogo pins) of the testing apparatus are brought into contact with and compressed against the first input and first output test pads CP1 and CO1 and the first and second touch pads TP1 and TP2. In addition, a test signal for detecting compression deviations with the pogo pads is applied to the first input and first output test pads CP1 and CO1 through the pogo pads. The processes of supplying the test signal and detecting the amount of current are carried out, and then the touch driving test is completed and the pogo pads are detached. The first input and first output test pads CP1 and CO1 remain in a floating state.

The touch detection module may be mass-produced, with the display circuit board 300 connected to or mounted on one side of the flexible film. In addition, the touch detection module may be mass-produced, with the display circuit board 300 not connected thereto, while the touch detecting unit and the flexible film are connected thereto.

As shown in FIGS. 1 to 3, when the display circuit board 300 is connected to one side of the flexible film, the display pad area DPA and the first and second touch pad areas TPA1 and TPA2 of the pad area PD may be associated with pads of the display panel 100 connected to the display circuit board 300. Accordingly, the pads of the display panel 100 may be in contact with the display pads DP, the first touch pads TP1 and the second touch pads TP2. The display pads DP, the first touch pads TP1 and the second touch pads TP2 may be electrically connected to the pads of the display circuit board 300 using a low-resistance, high-reliability material such as an anisotropic conductive layer and a SAP. Therefore, the display pads DP, the first touch pads TP1 and the second touch pads TP2 may be electrically connected to the touch driver circuit 400 disposed on the display circuit board 300.

When the display circuit board 300 is connected to the subsidiary area SBA, the first input and first output test pads CP1 and CO1 disposed in the first and second test pad areas TCP1 and TCP2, respectively, are not connected to the display circuit board 300 or the pads of the display panel 100 but remain in the floating state. Accordingly, the test signal transmission line CL connected to the first input and first output test pads CP1 and CO1 also remains in the floating state.

When the touch detection module is mass-produced with a structure in which only the touch detecting unit and the flexible film are connected thereto and in which the display circuit board 300, the first and second touch pads TP1 and TP2 and the first input and the first output test pads CP1 and CO1 are not connected thereto and are all in the floating state.

Figure 5:
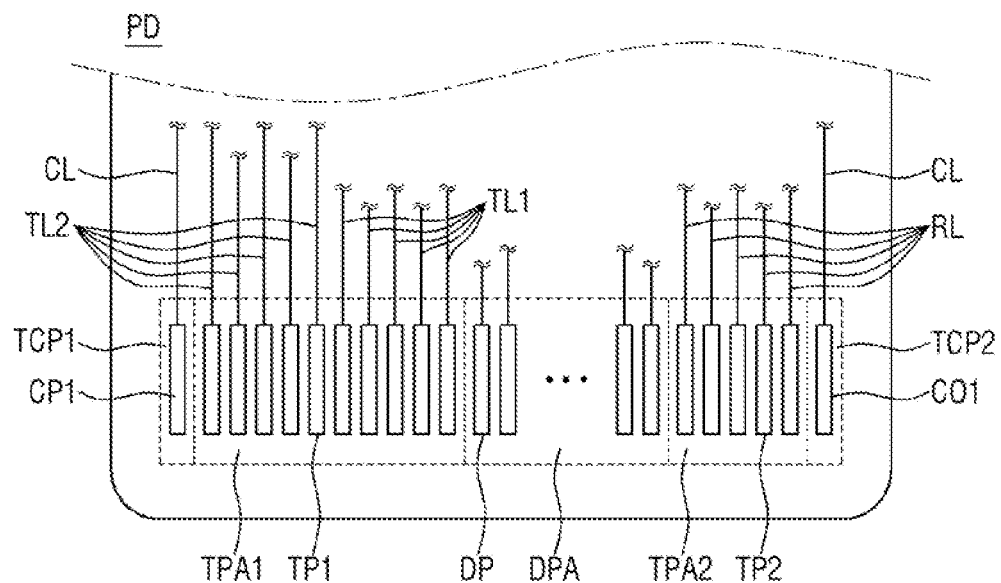
FIG. 5 is a plan view illustrating an arrangement structure of the touch pads in the pad area shown in FIG. 4.

FIG. 5 is a plan view illustrating the arrangement structure of the touch pads and the test pads in the pad area shown in FIG. 4.

Referring to FIG. 5, the pad area PD of the touch detection module includes a display pad area DPA in which display pads DP are disposed, a first touch pad area TPA1 in which first touch pads TP1 are disposed, a first test pad area TCP1 in which a first input test pad CP1 is disposed, a second touch pad area TPA2 in which the second touch pads TP2 are arranged, and a second test pad area TCP2 in which a first output test pad CO1 is disposed.

The first touch pad area TPA1 in which the first touch pads TP1 are disposed may be arranged on a first side of the display pad area DP in which the display pads DPA are disposed. In addition, the first test pad area TCP1 in which the first input test pad CP1 is disposed may be disposed on one side of the first touch pad area TPA1. For example, the first touch pad area TPA1 may be disposed between the first test pad area TCP1 and the display pad area DPA. The second touch pad area TPA2 in which the second touch pads TP2 are disposed may be disposed on a second side, opposite to the first side, of the display pad area DPA. In addition, the second test pad area TCP2 in which the first output test pad CO1 is disposed may be disposed on a side of the second touch pad area TPA2. For example, the second touch pad area TPA2 may be disposed between the second test pad area TCP2 and the display pad area DPA. When the display device 10 and the touch detection module are attached and assembled together, the display pads DP of the display pad area DPA may be electrically connected to data lines of the display panel 100.

Among the first touch pads TP1, the first touch pads TP1 connected to the first touch driving lines TL1, respectively, are arranged in parallel to each other in the first touch pad area TPA1 on the first side of the display pad area DPA. For example, the first touch pads TP1 are arranged along the first direction (e.g., the x-axis direction). The second touch pads TP2 connected to the second touch driving lines TL2, respectively, are arranged in parallel to each other in the second touch pad area TPA2 on the second side, opposite to the first side, of the display pad area DPA.

The first input test pad CP1 of the first test pad area TCP1 may be connected to one end of the test signal transmission line CL disposed in the touch peripheral area TPA such that it surrounds all of the touch detecting unit TDU, the first and second touch driving lines TL1 and TL2 and the touch sensing lines RL. The first output test pad CO1 of the second test pad area TCP2 may be connected to the other end of the test signal transmission line CL.

Figure 6:
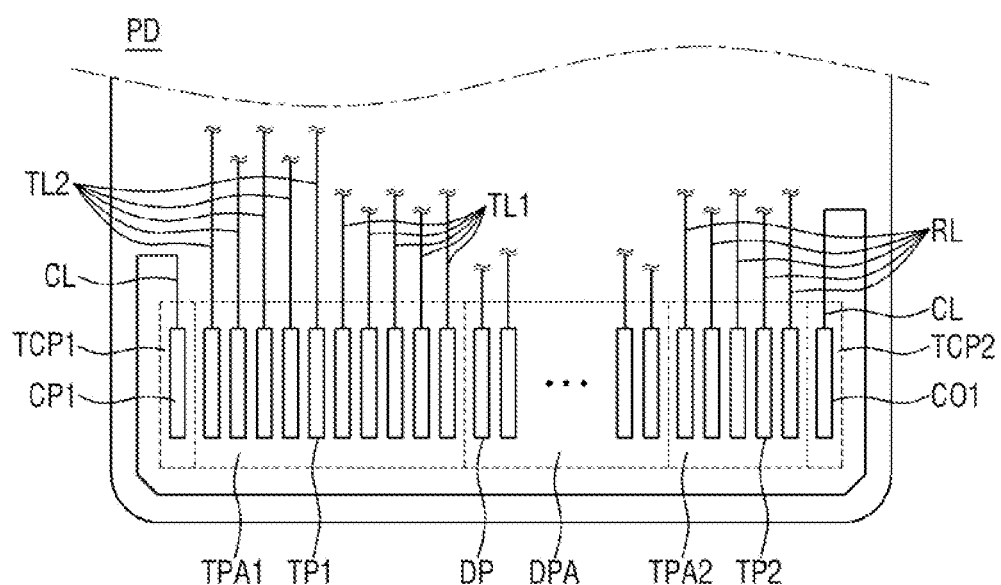
FIG. 6 is a plan view illustrating an arrangement structure of the test signal transmission lines shown in FIG. 4.

FIG. 6 is a plan view illustrating an arrangement structure of the test signal transmission line shown in FIGS. 4 and 5.

Referring to FIG. 6, a test signal transmission line CL may be disposed along the outer side of the pad area PD such that it surrounds the display pad area DPA, the first and second touch pad areas TPA1 and TPA2 and at least one side and the lower side of the first and second test pad areas TCP1 and TCP2. For example, the test signal transmission line CL may be extended along a first side, the lower side and the second side, opposite to the first side, of the pad area PD. One end of the test signal transmission line CL is connected to a first input test pad CP1 disposed at one end of the pad area PD, while the other end of the test signal transmission line CL is connected to a first output test pad CO1 disposed at the other end of the pad area PD. The test signal transmission line CL is not limited to the structure of FIG. 6. The test signal transmission line CL may be disposed along one side and the lower side of the pad area PD such that it surrounds the one side and the lower side of the pad area PD. The test signal transmission line CL may also be disposed along one side and the lower side of the pad area PD such that it surrounds the one side and the lower side of the pad area PD.

In the example shown in FIG. 6, one end of the test signal transmission line CL is connected to the upper side of the first input test pad CP1 while the other end of the test signal transmission line CL is connected to the upper side of the first output test pad CO1. It should be understood, however, that the present invention is not limited thereto. One end of the test signal transmission line CL may be connected to a side, an upper side or the lower side of the first input test pad CP1. In addition, the other end of the test signal transmission line CL may be connected to a side, an upper side or the lower side of the first output test pad CO1.

Figure 7:
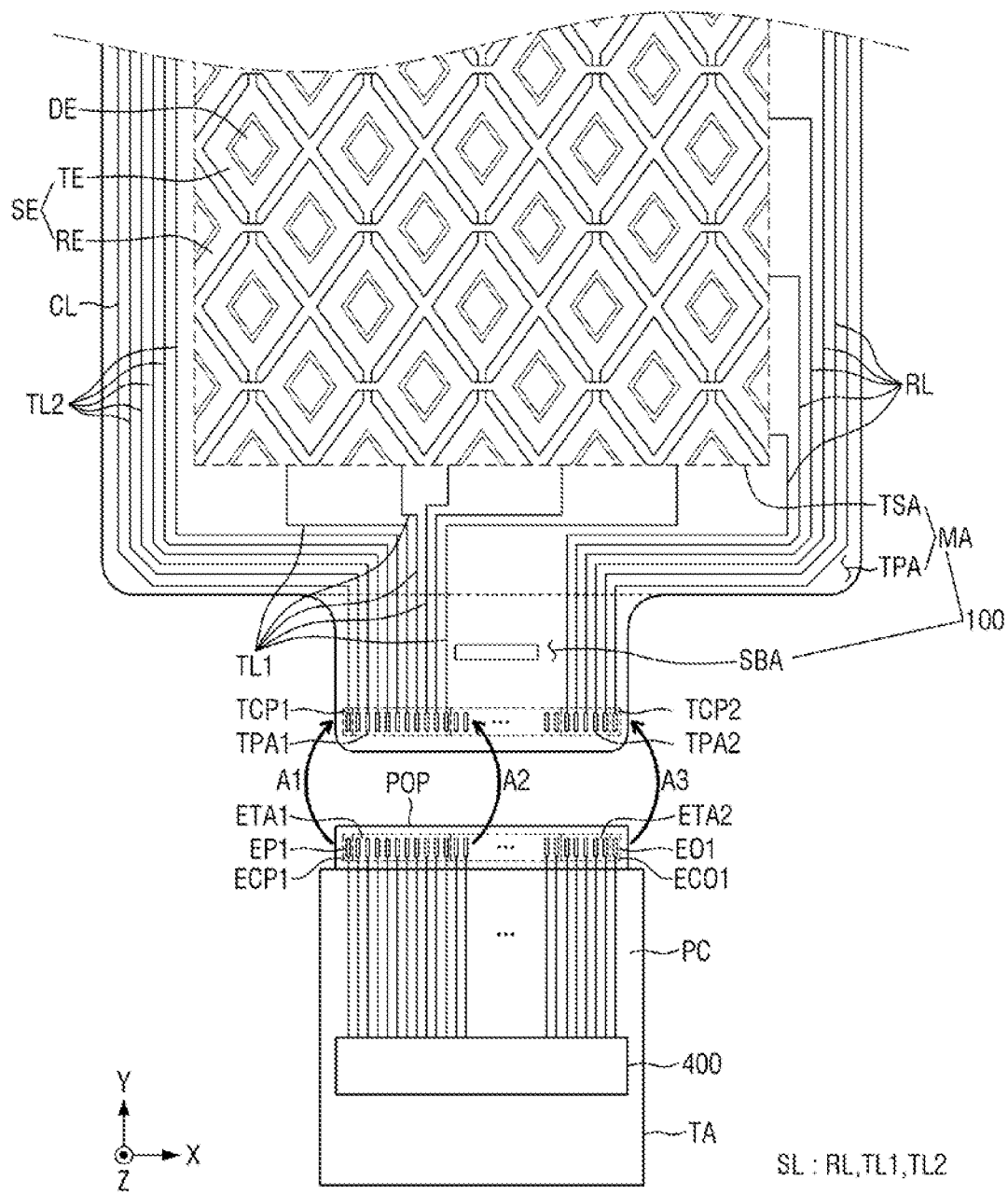
FIG. 7 is a plan view illustrating the arrangement structure between the touch detection module shown in FIG. 4 and the testing apparatus.
Figure 8:
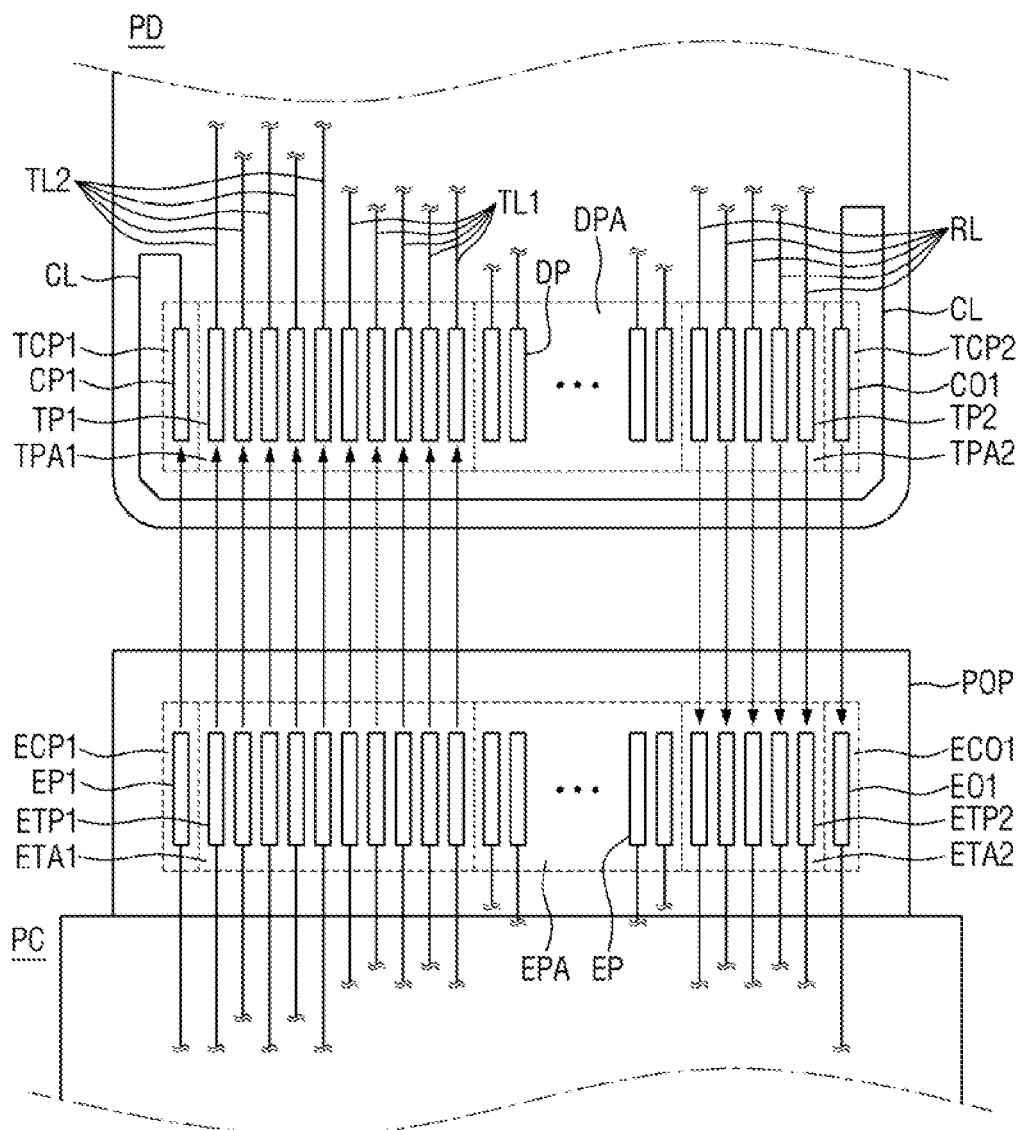
FIG. 8 is a plan view illustrating the arrangement structure between the pad area of the touch detection module and the pogo pads of the testing apparatus shown in FIG. 7.

FIG. 7 is a plan view illustrating the arrangement structure between the touch detection module shown in FIG. 4 and the testing apparatus. FIG. 8 is a plan view illustrating the arrangement structure between the pad area of the touch detection module and the pogo pads of the testing apparatus shown in FIG. 7.

Referring to FIGS. 7 and 8, the touch testing apparatus TA includes a pogo pad area POP, a test touch driver circuit 400, and a test board PC.

The pogo pad area POP includes a plurality of pogo pads or pogo pins, which are connected to the first and second touch pads TP1 and TP2 and the first input and first output test pads CP1 and CO1 of the touch detection module, respectively.

For example, the pogo pad area POP includes a display pogo area EPA in which display pogo pads EP are disposed, a first touch pogo area ETA1 in which first touch pogo pads ETP1 are disposed, a second touch pogo area ETA2 in which second touch pogo pads ETP2 are disposed, a first input pogo area ECP1 in which a first input test pogo pad EP1 is disposed, and a first output pogo area ECO1 in which the first output test pogo pad EO1 is disposed.

When the touch detection module is tested, the pogo pad area POP moves in the direction indicated by the arrows A1, A2 and A3 of FIG. 7 to be located on the pad area PD of the touch detection module. Accordingly, the pogo pad area POP is connected to the pad area PD of the touch detection module.

Referring to FIG. 8, the display pogo area EPA of the pogo pad area POP may correspond with the display pad area DPA formed in the pad area PD of the touch detection module. The display pogo pads EP respectively connected to the display pads DP disposed in the display pad area DPA are disposed in the display pogo area EPA.

The first touch pogo area ETA1 of the pogo pad area POP may correspond with the first touch pad area TPA1 formed in the pad area PD. First touch pogo pads ETP1 respectively connected to the first touch pads TP1, disposed in the first touch pad area TPA1, are disposed in the first touch pogo area ETA1.

The second touch pogo area ETA2 of the pogo pad area POP may correspond to the second touch pad area TPA2 formed in the pad area PD. Second touch pogo pads ETP2 respectively connected to the second touch pads TP2 disposed in the second touch pad area TPA2 are disposed in the second touch pogo area ETA2.

The first output pogo area ECO1 of the pogo pad area POP may correspond to the first test pad area TCP1 formed in the pad area PD. The first input test pogo pad EP1 connected to the first input test pad CP1 disposed in the first test pad area TCP1 is disposed in the first input pogo area ECP1.

The first output pogo area ECO1 of the pogo pad area POP may correspond to the second test pad area TCP2 formed in the pad area PD. The first output test pogo pad EO1 connected to the first output test pad CO1 disposed in the second test pad area TCP2 is disposed in the first output pogo area ECO1.

The test touch driver circuit 400 may be electrically connected to the display pads DP, the first and second touch pads TP1 and TP2, and first input and first output test pads CP1 and CO1 in the pad area PD through the display pogo pads EP, the first and second touch pogo pads ETP1 and ETP2, and the first input and first output test pogo pads EP1 and EO1.

The test touch driver circuit 400 supplies touch driving signals to the first touch pads TP1 and the driving electrodes TE through the first touch pogo pads ETP1. In addition, the test touch driver circuit 400 detects a change in the amount of charges stored in the mutual capacitance of each of the touch nodes TN through the second touch pogo pads ETP2, and generates touch data items based on the change in the amount of capacitance of each of the touch nodes TN.

The test touch driver circuit 400 transmits a test signal to the first input test pad CP1 and the test signal transmission line CL through the first input test pogo pad EP1. In addition, compression deviations between the first input and first output test pads CP1 and CO1 and the first input and first output test pogo pads EP1 and EO1 are detected based on a change in the amount of current of the test signal output from the first output test pad CO1.

The test touch driver circuit 400 detects a resistance value according to compression deviations between the first input and first output test pads CP1 and CO1 and the first input and first output test pogo pads EP1 and EO1, respectively. For example, the resistance value is detected according to compression deviations between the first input test pad CP1 and the first input test pogo pad EP1 and between the first output test pad CO1 and the first output test pogo pad EO1. Then, the touch data items are corrected by using predetermined compensation data according to the resistance value. The corrected touch data items may be transmitted to an external test monitoring apparatus, etc. The cause of defects, such as a touch data defect and a communication defect, can be identified from analysis results of the corrected touch data items.

The test board PC may be implemented as, for example, a flexible printed circuit board, a printed circuit board, or a flexible film such as a chip on film. The test touch driver circuit 400 may be implemented as an integrated circuit and mounted on the test board PC by, but the present invention is not limited to the chip-on-glass (COG) technique, the chip-on-plastic (COP) technique, or ultrasonic bonding. For example, the test touch driver circuit 400 may be mounted on the test board PC by the chip-on-film (COF) technique. The test touch driver circuit 400 mounted on the test board PC is electrically connected to the display pogo pads EP, the first and second touch pogo pads ETP1 and ETP2, and the first input and first output test pogo pads EP1 and EO1 through a plurality of lines formed on the test board PC.

Figure 9:
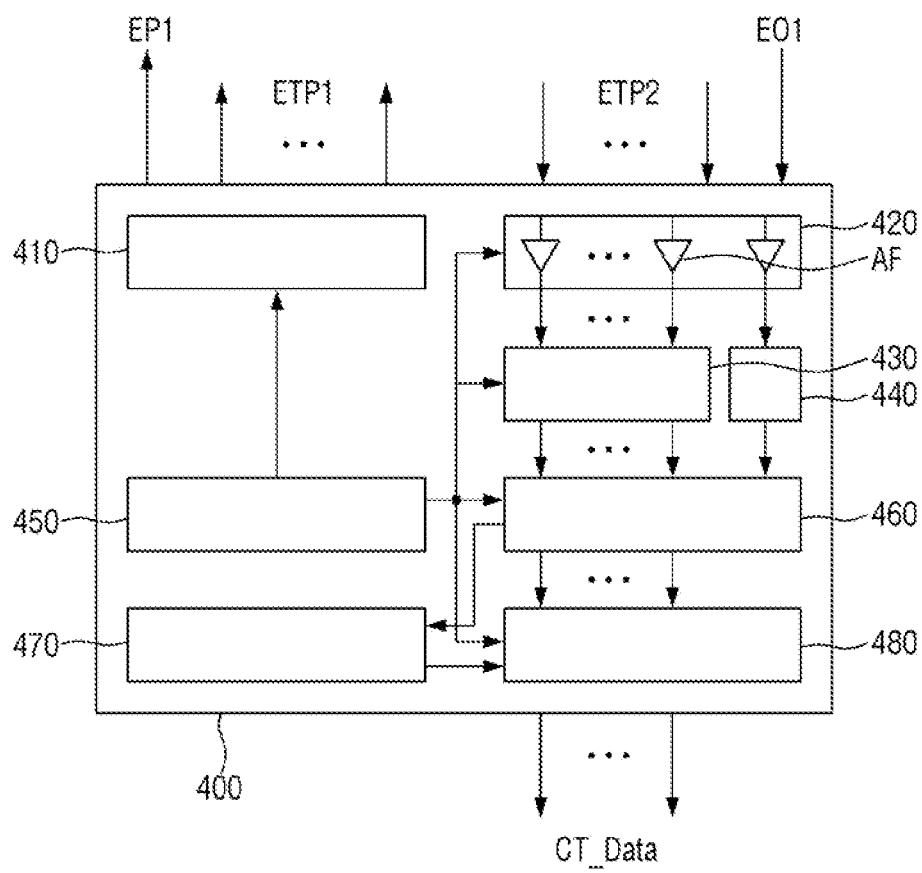
FIG. 9 is a block diagram illustrating the structure of the test touch driver circuit shown in FIG. 7.

FIG. 9 is a block diagram illustrating the structure of the test touch driver circuit of the testing apparatus shown in FIG. 7.

Referring to FIG. 9, the test touch driver circuit 400 includes a driving signal output 410, a sensing circuit 420, an analog-to-digital converter 430, a current detector 440, a touch driving controller 450, a compression deviation detector 460, a compensation data storage 470, and a data compensator 480.

The driving signal output (e.g., a driving signal output circuit) 410 supplies touch driving signals to the first touch pads TP1 and the driving electrodes TE of the touch detection module through the first touch pogo pads ETP1. The driving signal output 410 may sequentially output touch driving signals from the driving electrodes TE disposed at the leftmost position of the touch sensing area TSA to the driving electrodes TE disposed at the rightmost position of the touch sensing area TSA. For example, the touch driving signals may be supplied as multiple pulse signals generated with the magnitude of about 1.8 V.

In addition, the driving signal output 410 transmits a test signal to the first input test pad CP1 and the test signal transmission line CL of the touch detection module through the first input test pogo pad EP1. For example, the test signal may be supplied as multiple pulse signals generated with the magnitude of about 1.8 V or may be supplied as a DC voltage generated with the magnitude of about 1.8 V. It should be understood, however, that the present invention is not limited thereto. For example, the test signal may be supplied as multiple pulse signals generated with the magnitude of about 3.2 V or a DC voltage generated with the magnitude of about 3.2 V.

The sensing circuit 420 senses a change in the amount of charges stored in the mutual capacitance of each of the touch nodes TN from the touch sensing lines RL and the second touch pads TP2 of the touch detection module through the second touch pogo pads ETP2. The sensing circuit 420 may include operational amplifiers AF for sensing a change in the amount of charges stored in the mutual capacitances of the touch nodes TN. The operational amplifiers AF may be connected to the second touch pogo pads ETP2, respectively.

The sensing circuit 420 receives the test signal from the first output test pad CO1 through the first output test pogo pad EO1. Then, the received test signal is amplified through the operational amplifier AF and is output. In addition, the sensing circuit 420 may receive the test signal through the first input test pogo pad EP1 as well and may amplify the received test signal through the operational amplifier AF to output it.

The analog-to-digital converter 430 sequentially converts the voltages output from the second touch pogo pads ETP2 and amplified by the operational amplifiers AF of the sensing circuit 420, which are output voltages according to the change in the amount of charges of each of the touch nodes TN, into touch data, which is digital data. For example, the amplified test signals output from the sensing circuit 420 are received by the analog-to-digital converter 430 to be converted into touch data.

The touch driving controller 450 controls driving timings of the driving signal output 410, the sensing circuit 420, the analog-to-digital converter 430 and the data compensator 480. For example, the touch driving controller 450 may supply a control signal to each of the driving signal output 410, the sensing circuit 420, the analog-to-digital converter 430 and the data compensator 480.

The current detector 440 detects the amount of current from the test signal amplified by the operational amplifier AF of the sensing circuit 420. The current detector 440 may detect the amount of current, and may share the amount of detected current with the compression deviation detector 460.

The compression deviation detector 460 detects the compression deviations between the first input and first output test pads CP1 and CO1 and the first input and first output test pogo pads EP1 and EP1, respectively, according to the change in the amount of current detected by the current detector 440. For example, the compression deviation detector 460 sets the current value of the test signal output from the driving signal output 410 as the reference current value and stores it. Then, the compression deviation detector 460 compares the predetermined reference current value with the amount of detected current detected by the current detector 440. The compression deviation detector 460 calculates a resistance value based on a difference in the compared current values, and determines the resistance level according to the compression deviations between the first input and first output test pads CP1 and CO1 and the first input and first output test pogo pads EP1 and EO1, respectively. The compression deviation detector 460 shares the difference in the compared current values or the resistance value calculated by the difference in the current values with the compensation data storage 470.

If the difference in the current values detected by the compression deviation detector 460 or the resistance value calculated by the difference in the current values is shared, the compensation data storage 470 may output the compensation data corresponding to the difference in the current values or the resistance value among the compensation data items which are predetermined by experimental values.

The data compensator 480 stores touch data that are sequentially converted into digital data through the analog-to-digital converter 430, and corrects the touch data by adding or subtracting the compensation data to or from the stored touch data. Then, the corrected touch data items are transmitted to an external test monitoring apparatus or the like. In this manner, if a defect is detected, the cause of the defect such as touch data defect and a communication defect can be identified from the analysis results of the corrected touch data items.

FIG. 10 is a diagram illustrating an example of touch sensing data detected by the touch detection module and the touch driver circuit of FIG. 7. FIG. 11 is a diagram illustrating the amount of current detected through test signal output pads of FIG. 8 and the magnitude of resistance.

Referring to FIG. 10, the data compensator 480 arranges digital touch data items in sequence which are sequentially converted by the analog-to-digital converter 430 and stores them.

As shown in FIG. 11, the compression deviation detector 460 compares the amount of current detected in real time from the current detector 440 with a predetermined reference current value, thereby detecting a change in the amount of current based on the difference between the compared current values (e.g., between the detected current value and the reference current value). For example, the compression deviation detector 460 calculates a resistance value based on the difference in the compared current values, and determines compression deviation resistance between the first input and first output test pads CP1 and CO1 and the first input and first output test pogo pads EP1 and EO1, respectively.

FIG. 12 is a diagram illustrating an example of compensation data for compensating for touch sensing data according to compression deviations. FIG. 13 is a diagram illustrating an example of touch sensing data which was compensated by modulating it with the compensation data.

Referring to FIG. 12, the compensation data storage 470 extracts predetermined compensation data, corresponding to the shared difference in the current values or resistance value from the compression deviation detector 460, and outputs it to the data compensator 480. The compensation data items stored in the compensation data storage 470 may be set to data values having a predetermined size, so that they are added to or subtracted from the touch data. In addition, the compensation data may be set in the form of a predetermined weight value or threshold value so that it can be multiplied with the touch data.

Referring to FIG. 13, the data compensator 480 may correct the touch data by adding or subtracting the compensation data from the compensation data storage 470 to or from the sequentially stored touch data. In addition, the data compensator 480 may correct the touch data by multiplying the sequentially stored touch data by the weight value or threshold value from the compensation data storage 470.

In this manner, by correcting the touch data items according to the compression deviations between the first input and first output test pads CP1 and CO1 and the first input and the first output test pogo pads EP1 and EO1, respectively, through the test touch driver circuit 400 of the testing apparatus, it is possible to compensate for the compression deviations between the first touch pads TP1 and the first touch pogo pads ETP1, respectively. Accordingly, if a defect is detected in the touch detection module, it is possible accurately identify the cause of the defect, such as a touch data defect, because other causes, such as a communication defect and a compression deviation defect, during the test can be excluded.

Figure 14:
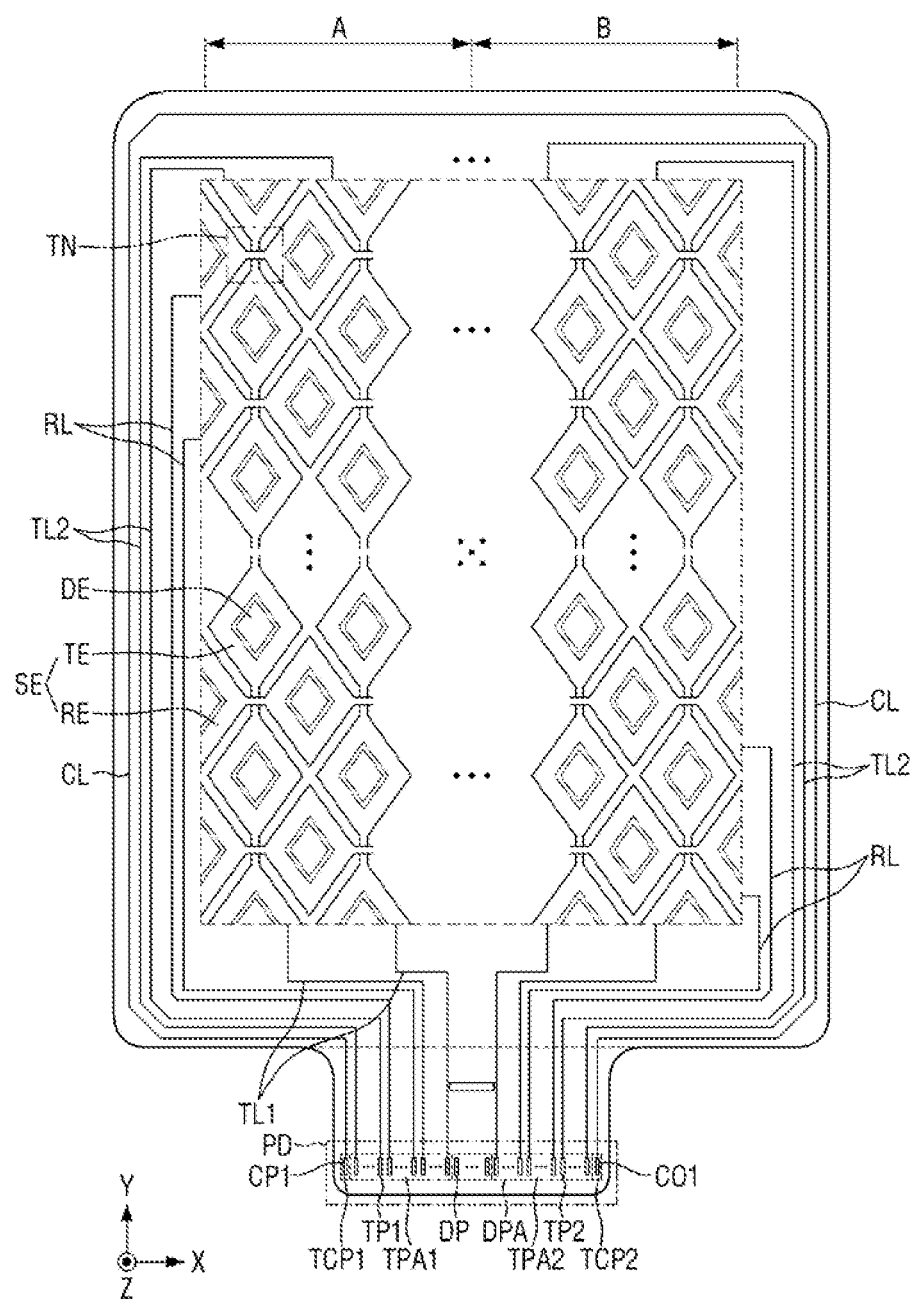
FIG. 14 is a view illustrating an example of a layout of the touch detection module shown in FIGS. 1 to 3.

FIG. 14 is a view illustrating an example of a layout of the touch detection module shown in FIGS. 1 to 3.

Referring to FIG. 14, the adjacent sensing electrodes RE in the first direction (e.g., the x-axis direction) are connected with one another, while the adjacent sensing electrodes RE in the second direction (e.g., the y-axis direction) are electrically separated from one another. Among all the sensing electrodes RE connected with one another in the first direction (e.g., the x-axis direction), the sensing electrodes RE disposed at the right end or the left end are connected to the touch sensing lines RL, respectively. For example, among all the sensing electrodes RE connected with one another other in the first direction (e.g., the x-axis direction), the sensing electrodes RE arranged in the half of the lines or rows may be connected to the touch sensing lines RL on the right side. In addition, among all the sensing electrodes RE connected with one another other in the first direction (e.g., the x-axis direction), the sensing electrodes RE arranged in the other half of the lines or rows may be connected to the touch sensing lines RL on the left side. For example, the first and second rows of the touch sensing electrodes RE may be connected to the touch sensing lines RL on the left side, while the third and fourth rows of the touch sensing electrodes RE, which are arranged below the first and second rows in the second direction (e.g., the y-axis direction), may be connected to the touch sensing lines RL on the right side. However, the present invention is not limited thereto.

For example, as shown in FIG. 14, among all the sensing electrodes RE connected with one another other in the first direction (e.g., the x-axis direction), the sensing electrodes RE arranged in the upper half of the lines in the second direction (e.g., the y-axis direction) may be connected to the touch sensing lines RL on the left side. In addition, the sensing electrodes RE arranged in the lower half of the lines in the second direction (e.g., the y-axis direction) may be connected to the touch sensing lines RL on the right side. It should be understood, however, that the present invention is not limited thereto. All the sensing electrodes RE connected with one another in the first direction (e.g., the x-axis direction) may be connected to the touch sensing lines RL on the left side or the right side, alternately, at least line by line or row by row.

Among the driving electrodes TE electrically connected with one another in the second direction (e.g., the y-axis direction), the driving electrodes TE disposed at the lower end of the touch sensing area TSA are connected to the first touch driving lines TL1, while the driving electrodes TE disposed at the upper end of the touch sensing area TSA are connected to the second touch driving lines TL2. In this instance, among the second touch driving lines TL2, the second touch driving lines TL2 arranged in the left half of the lines with respect to the center of the first direction (e.g., the x-axis direction) are connected to the driving electrodes TE on the upper side of the touch sensing area TSA around the left outer side of the touch sensing area TSA. For example, the second touch driving lines TL2 arranged in the left half of the lines may be with respect to the center of the touch sensing area TSA. In addition, among the second touch driving lines TL2, the second touch driving lines TL2 arranged in the right half of the lines with respect to the center of the first direction (e.g., the x-axis direction) are connected to the driving electrodes TE on the upper side of the touch sensing area TSA around the right outer side of the touch sensing area TSA. For example, the second touch driving lines TL2 arranged in the right half of the lines may be with respect to the center of the touch sensing area TSA. Accordingly, the touch sensing lines RL may be disposed between the second touch driving lines TL2 and the first touch driving lines TL1.

Figure 15:
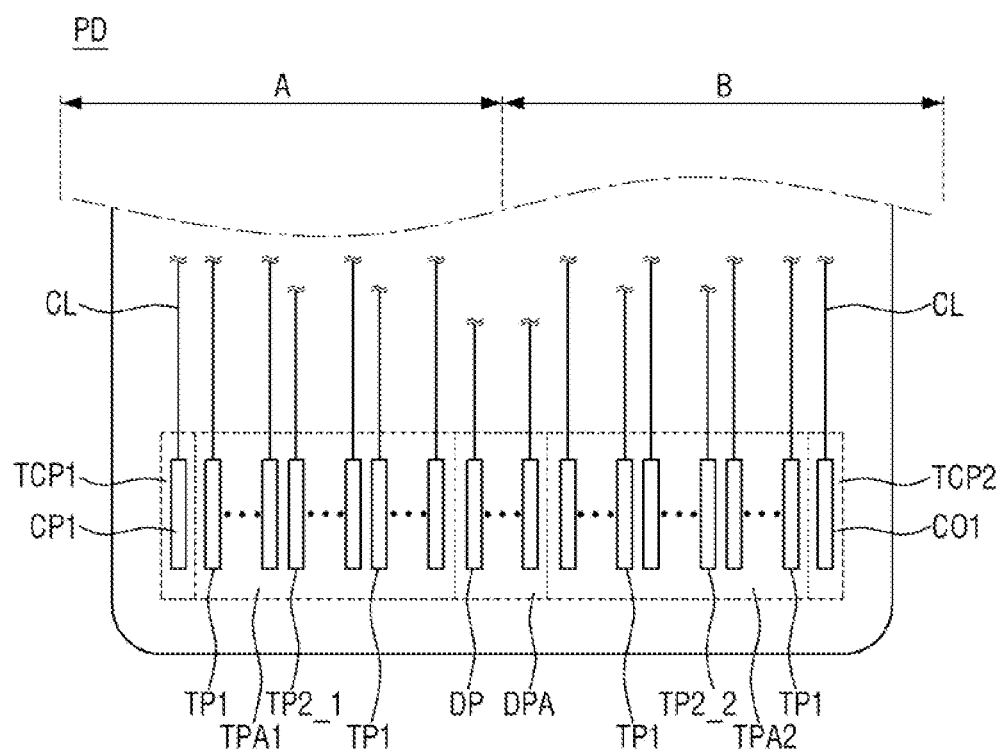
FIG. 15 is a plan view illustrating the arrangement structure of the touch pads in the pad area shown in FIG. 14.

FIG. 15 is a plan view illustrating the arrangement structure of the touch pads in the pad area shown in FIG. 14.

As shown in FIGS. 14 and 15, the touch sensing lines RL are connected to the second touch pads TP2, respectively, and the first and second touch driving lines TL1 and TL2 are connected to the first touch pads TP1, respectively. Similarly to the touch sensing lines RL disposed between the second touch driving lines TL2 and the first touch driving lines TL1, the second touch pads TP2 may be disposed between the first touch pads TP1.

The first touch pad area TPA1 is located on a first side of the display pad area DPA on which the display pads DP are disposed, and the first test pad area TCP1 is located on a first side of the first touch pad area TPA1. In addition, the second touch pad area TPA2 is located on a second side, opposite to the first side, of the display pad area DPA, and the second test pad area TCP2 is located on a first side of the second touch pad area TPA2.

In the first touch pad area TPA1, the first touch pads TP1 connected to the first touch driving lines TL1, the second touch pads TP2_1 connected to the touch sensing lines RL extended around the left side of the touch sensing area TSA, and the first touch pads TP1 connected to the second touch driving lines TL2 are sequentially arranged. In addition, the first input test pad CP1 is disposed in the first test pad area TCP1.

In the second touch pad area TPA2, the first touch pads TP1 connected to the first touch driving lines TL1, the second touch pads TP2_2 connected to the touch sensing lines RL extended around the right side of the touch sensing area TSA, and the first touch pads TP1 connected to the second touch driving lines TL2 are sequentially arranged. In addition, the first output test pad CO1 is disposed in the second test pad area TCP2.

Figure 16:
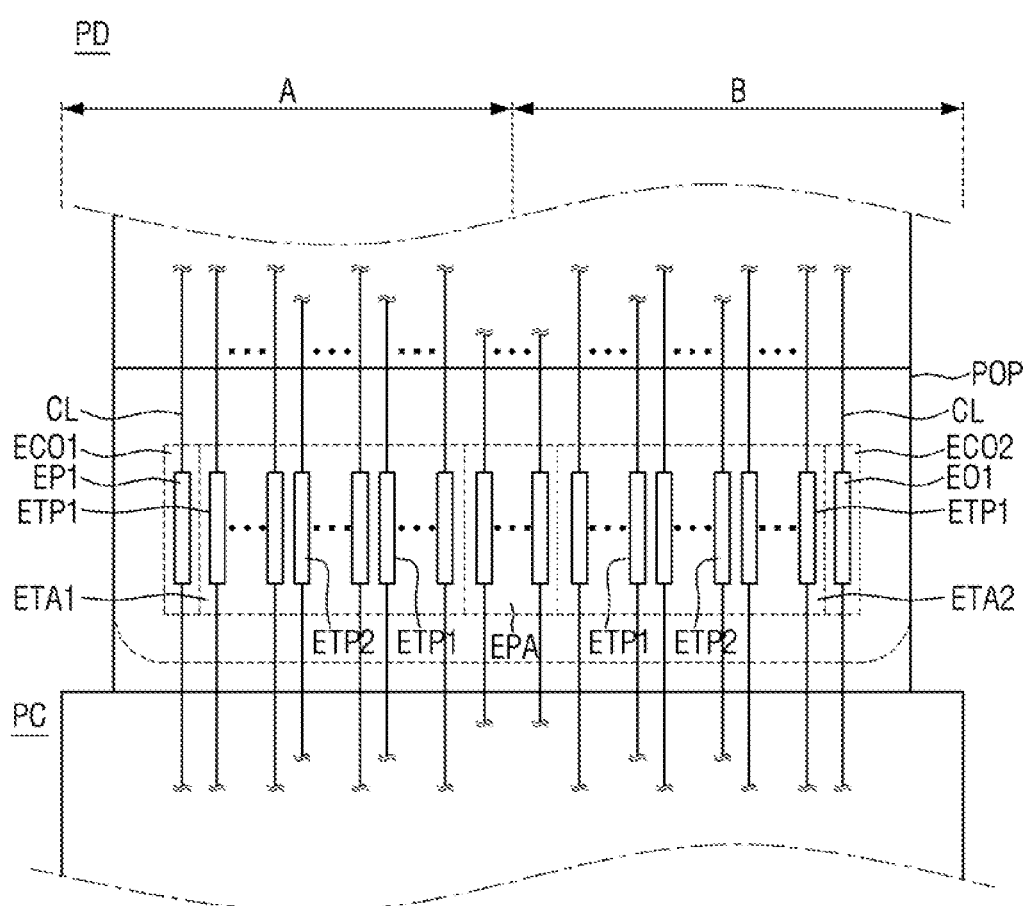
FIG. 16 is a plan view illustrating the structure of the pogo pad area in contact with the pad area of the touch detection module shown in FIGS. 14 and 15.

FIG. 16 is a plan view illustrating the structure of the pogo pad area of the testing apparatus connected to the pad area of the touch detection module shown in FIG. 15.

Referring to FIGS. 15 and 16, the pogo pad area POP is divided into the display pogo area EPA corresponding to the display pad area DPA of the pad area PD, the first touch pogo area ETA1 corresponding to the first touch pad area TPA1 of the pad area PD, the second touch pogo area ETA2 corresponding to the second touch pad area TPA2 of the pad area PD, and first input and first output pogo areas ECP1 and ECO1 respectively corresponding to the first input test and second test pad areas TCP1 and TCP2 of the pad area PD.

As described above, in the first touch pad area TPA1 of the pad area PD, the first touch pads TP1 connected to the first touch driving lines TL1, the second touch pads TP2_1 connected to the touch sensing lines RL, and the first touch pads TP1 connected to the second touch driving lines TL2 are arranged sequentially. Accordingly, in the first touch pogo area ETA1, the first touch pogo pads ETP1 connected to the first touch pads TP1, the second touch pogo pads ETP2 connected to the second touch pads TP2_1, and the first touch pogo pads ETP1 connected to the first touch pads TP1 connected to the second touch driving lines TL2 are arranged sequentially.

In the second touch pad area TPA2 of the pad area PD, the first touch pads TP1 connected to the first touch driving lines TL1, the second touch pads TP2_2 connected to the touch sensing lines RL, and the first touch pads TP1 connected to the second touch driving lines TL2 are sequentially arranged. Accordingly, in the second touch pogo area ETA2, the first touch pogo pads ETP1 connected to the first touch pads TP1, which are connected to the first touch driving lines TL1, the second touch pogo pads ETP2 connected to the second touch pads TP2_2, and the first touch pogo pads ETP1 connected to the first touch pads TP1 connected to the second touch driving lines TL2 are arranged sequentially.

FIG. 17 is a diagram illustrating an example of touch sensing data detected by the touch detection module and the touch driver circuit of FIG. 14. FIG. 18 is a diagram illustrating an example of compensation data for compensating for touch sensing data according to compression deviations.

Referring to FIGS. 17 and 18 in conjunction with FIG. 15, the sensing circuit 420 senses output voltages output separately from the second touch pogo pads ETP2 of the first touch pogo area ETA1 and the second touch pogo pads ETA2 of the second touch pogo area ETA2. For example, the sensing circuit 420 senses changes in the amount of charges stored at the touch nodes TN, which are output separately from the second touch pogo pads ETP2 of the first touch pogo area ETA1 and the second touch pogo pads ETP2 of the second touch pogo area ETA2, and amplify them to output them to the analog-to-digital converter 430. In addition, the sensing circuit 420 amplifies the test signals separately detected from the first input and first output test pogo pads EP1 and EO1, and outputs the amplified test signals to the current detector 440.

The analog-to-digital conversion unit 430 separately converts the output voltages from the sensing circuit 420, which correspond to the output voltages from the first and second touch pogo areas ETA1 and ETA2, into digital touch data. For example, the output voltages from the sensing circuit 420 are separately converted by the analog-to-digital conversion unit 430.

As shown in FIG. 17, the data compensator 480 sorts the converted digital touch data items, which correspond to the first and second touch pogo areas ETA1 and ETA2, from the analog-to-digital converter 430 to store them. For example, the converted digital touch data items are sorted into the touch data of the first area ETA1_Data and touch data of the second area ETA2_Data.

The current detector 440 detects the amount of current of the test signals that are output separately from the first input and first output test pogo pads EP1 and EO1 and amplified by the operational amplifiers AF of the sensing circuit 420. In doing so, the compression deviation detector 460 compares the predetermined reference current value with the amount of current detected from the first input test pogo pad EP1, and compares the reference current value with the amount of current detected from the first output test pogo pad EO1. By calculating the resistance value according to the difference in the compared current values, it is possible to determine the resistance levels according to the compression deviations between the first input test pad CP1 and the first input test pogo pad EP1, and the compression deviations between the first output test pad CO1 and the first output test pogo pad EO1. In addition, the compression deviation detector 460 shares a first resistance value according to the compression deviations between the first input test pad CP1 and the first input test pogo pad EP1 and a second resistance value according to the compression deviations between the first output test pad CO1 and the first output test pogo pad EO1, with the compensation data storage 470.

When the first resistance value according to the compression deviations between the first input test pad CP1 and the first input test pogo pad EP1 and the second resistance value according to the compression deviations between the first output test pad CO1 and the first output test pogo pad EO1 are shared, the compensation data storage 470 outputs to the data compensator 480 first and second compensation data 1_BData and 2BData predetermined by experimental values to correspond to the respective first and second resistance values.

FIG. 19 is a diagram illustrating an example of touch sensing data which was compensated by modulating it with the compensation data.

Referring to FIG. 19, the data compensator 480 separately stores touch data ETA1_Data of the first area and touch data ETA2_Data of the second area that were digitally converted through the analog-to-digital converter 430. Then, the stored touch data ETA1_Data of the first area is corrected by adding or subtracting the first compensation data 1_BData to or from the touch data ETA1_Data of the first area. In addition, the touch data ETA2_Data of the second area is corrected by adding or subtracting the second compensation data 2_BData to or from the touch data ETA2_Data of the second area.

In this manner, it is possible to correct and compensate for the touch data ETA1_Data of the first area and the touch data ETA2_Data of the second area differently so that they correspond to the compression deviations between the first input test pad CP1 and the first input test pogo pad EP1 and the compression deviations between the first output test pad CO1 and the first output test pogo pad EO1, respectively. In addition, as an example, the data compensator 480 transmits the corrected touch data 1_TData and 2_TData of the first and second areas to an external test monitoring apparatus or the like. In this manner, if a defect is detected, the cause of the defect such as a touch data defect and a communication defect can be identified from the analysis results of the corrected touch data items.

Figure 20:
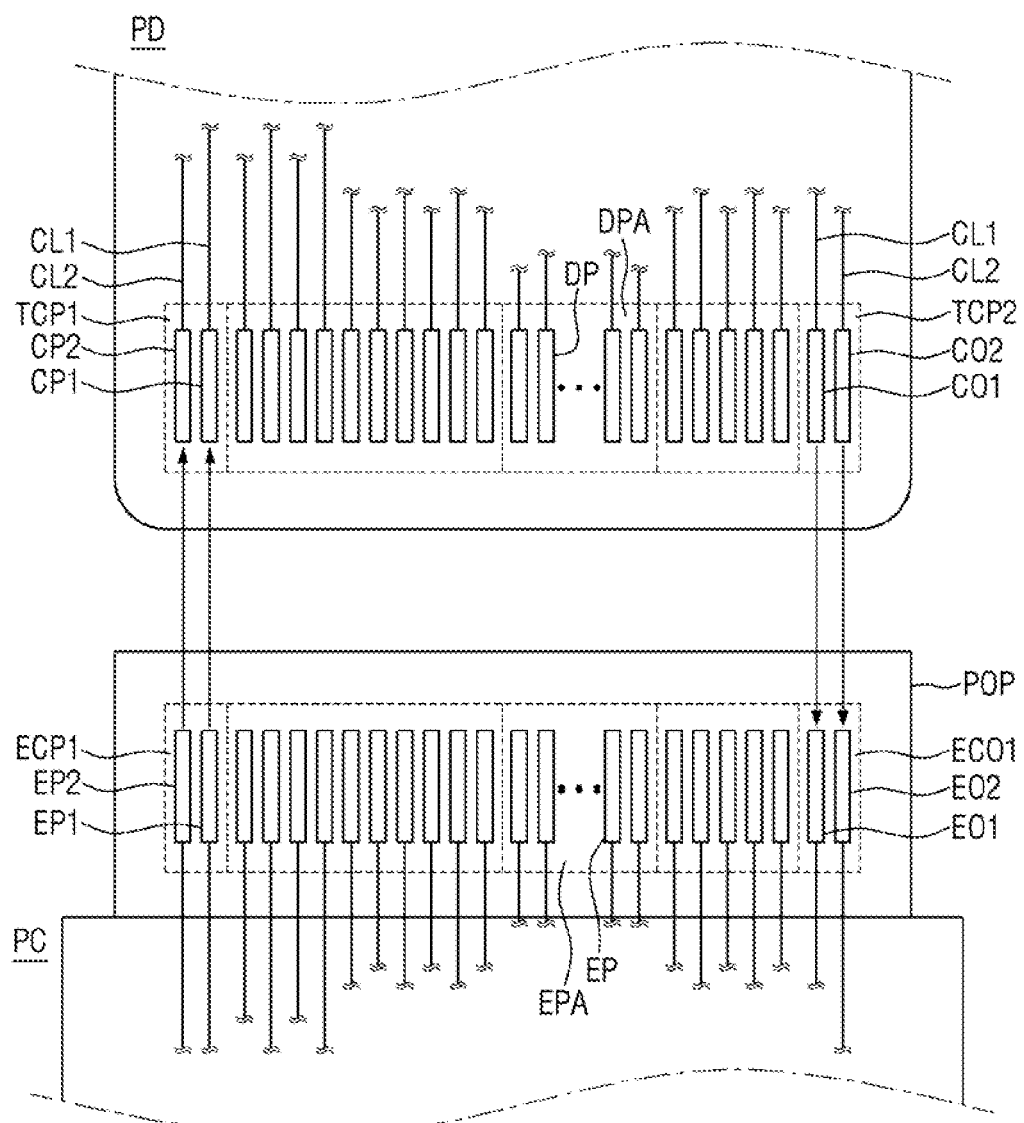
FIG. 20 is a plan view illustrating an arrangement structure of the test signal input and output pads and the test signal transmission lines shown in FIG. 17.

FIG. 20 is a plan view illustrating an arrangement structure of the test signal input and output pads and the test signal transmission lines shown in FIG. 17.

Referring to FIG. 20, a plurality of input test pads CP1 and CP2 may be disposed in a first test pad area TCP1 formed in a pad area PD of a touch detection module. For example, a pair of first and second input test pads CP1 and CP2 may be disposed in parallel to each other in the first test pad area TCP1. In addition, a plurality of output test pads CO1 and CO2 may be disposed in a second test pad area TCP2. For example, a pair of first and second output test pads CO1 and CO2 may be disposed in parallel to each other in the second test pad area TCP2. The pad arrangement structure of the display pad area DPA, the first touch pad area TPA1 and the second touch pad area TPA2 may be substantially identical to the pad arrangement structure of the pad area PD described above with reference to FIG. 5.

The first input test pad CP1 of the first test pad area TCP1 may be connected to one end of the first test signal transmission line CL1 disposed in the touch peripheral area TPA such that it at least partially surrounds all of the touch detecting unit TDU, the first and second touch driving lines TL1 and TL2 and the touch sensing lines RL. The first output test pad CO1 of the second test pad area TCP2 may be connected to the other end of the first test signal transmission line CL1.

The second input test pad CP2 may be connected to one end of the second test signal transmission line CL2 that at least partially surrounds the first test signal transmission line CL1. The second output test pad CO2 of the second test pad area TCP2 may be connected to the other end of the second test signal transmission line CL2.

Test signals may be applied to the first and second input test pads CP1 and CP2, and test signals may be output to the first and second output test pads CO1 and CO2.

A pogo pad area POP includes a first input pogo area ECP1 corresponding to the first test pad area TCP1 of the pad area PD, and a first output pogo area ECO1 corresponding to the second test pad area TCP2 of the pad area PD.

A plurality of input test pogo pads EP1 and EP2, which are respectively connected to the plurality of input test pads CP1 and CP2, is disposed in the first input pogo area ECP1 of the pogo pad area POP. For example, first and second input test pogo pads EP1 and EP2 respectively connected to the first and second input test pads CP1 and CP2 may be disposed in the first input pogo area ECP1.

A plurality of output test pogo pads EO1 and EO2, which are respectively connected to the plurality of output test pads CO1 and CO2, is disposed in the first output pogo area ECO1. For example, first and second output test pogo pads EO1 and EO2 respectively connected to the first and second output test pads CO1 and CO2 may be disposed in the first output pogo area ECO1.

The test touch driver circuit 400 may be electrically connected to the display pads DP, the first and second touch pads TP1 and TP2, the first and second input test pads CP1 and CP2, and the first and second output test pads CO1 and CO2 of the pad area PD through the display pogo pads EP, the first and second touch pogo pads ETP1 and ETP2, the first and second input test pogo pads EP1 and EP2, and the first and second output test pogo pads EO1 and EO2.

The test touch driver circuit 400 may transmit test signals to the first and second input test pads CP1 and CP2 and the first and second test signal transmission lines CL1 and CL2 through the first and second input test pogo pads EP1 and EP2. In addition, it is possible to detect compression deviations between the first and second input test pads CP1 and CP2 and the first and second input test pogo pads EP1 and EP2, respectively, based on the change in the amount of current of the test signals input to the first and second input test pogo pads EP1 and EP2. In addition, it is possible to detect compression deviations between the first and second output test pads CO1 and CO2 and the first and second output test pogo pads EO1 and EO2, respectively.

Figure 21:
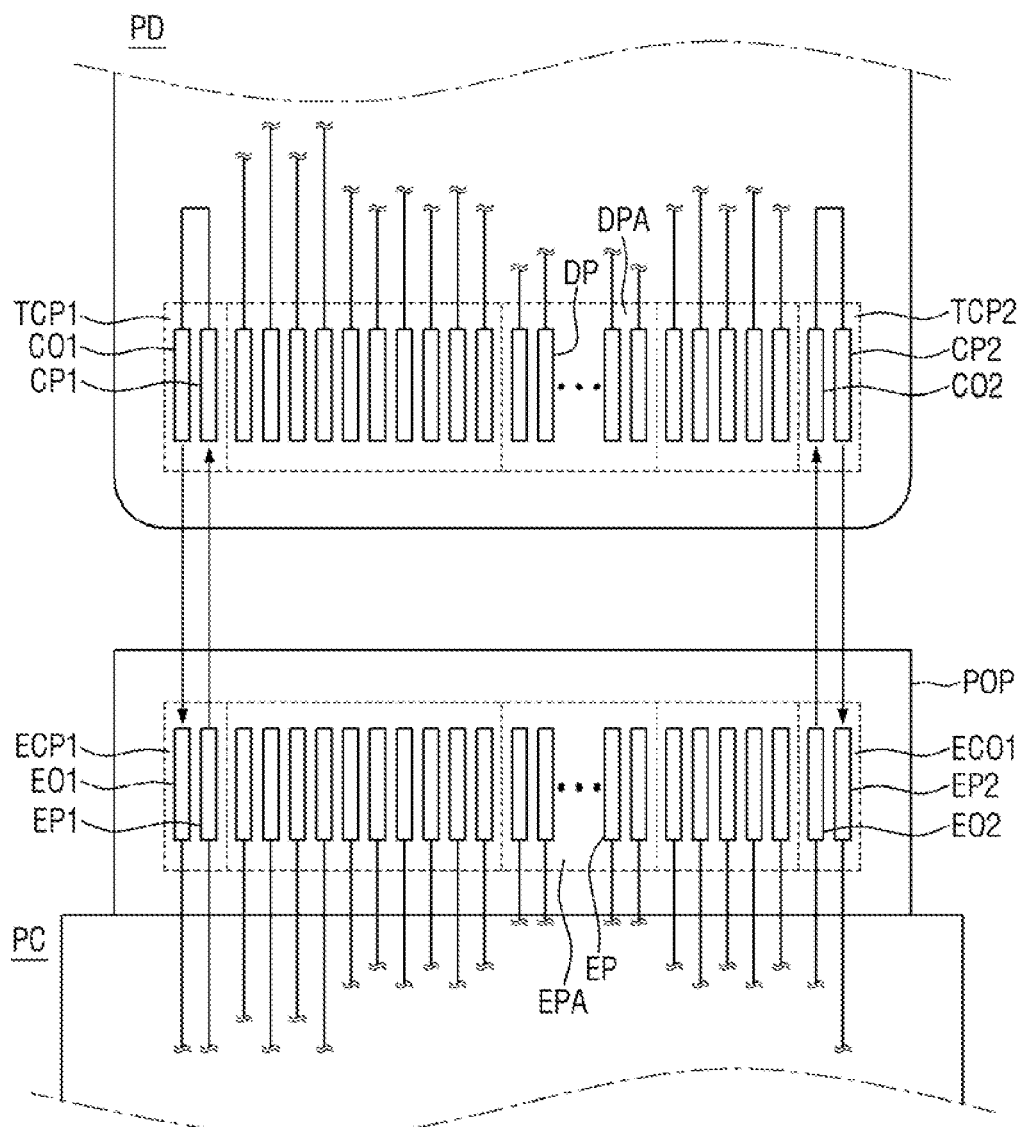
FIG. 21 is a plan view illustrating an arrangement structure of the test signal transmission lines shown in FIG. 20.

FIG. 21 is a plan view illustrating an arrangement structure of the test signal transmission lines shown in FIG. 20.

Referring to FIG. 21, a pair of a first input test pad CP1 and a first output test pad CO1 may be disposed in parallel to each other in a first test pad area TCP1 formed in a pad area PD of a touch detection module. In addition, a pair of a second input test pad CP2 and a second output test pad CO2 may be disposed in parallel to each other in a second test pad area TCP2. The pad arrangement structure of the display pad area DPA, the first touch pad area TPA1 and the second touch pad area TPA2 may be substantially identical to the pad arrangement structure of the pad area PD described above with reference to FIG. 5.

The first input test pad CP1 and the first output test pad CO1 of the first test pad area TCP1 may be electrically connected with each other through at least one line. In addition, the second input test pad CP2 and the second output test pad CO2 of the second test pad region TCP2 may also be electrically connected with each other through at least one line.

A test signal may be applied to the first input test pad CP1 of the first test pad area TCP1, and the test signal may be output from the first output test pad CO1. In addition, a test signal may be applied to the second input test pad CP2 of the second test pad area TCP2, and the test signal may be output from the second output test pad CO2.

A pogo pad area POP includes a first input pogo area ECP1 corresponding to the first test pad area TCP1 of the pad area PD, and a first output pogo area ECO1 corresponding to the second test pad area TCP2 of the pad area PD.

A first input test pogo pad EP1 and a first output test pogo pad EO1, which are respectively connected to the first input test pad CP1 and the first output test pad CO1, are disposed in the first input pogo area ECP1 of the pogo pad area POP. In addition, a second input test pogo pad EP2 and a second output test pogo pad EO2, which are respectively connected to the second input test pad CP2 and the second output test pad CO2, are disposed in the first output pogo area ECO1.

The test touch driver circuit 400 may be electrically connected to the display pads DP, the first and second touch pads TP1 and TP2, the first and second input test pads CP1 and CP2, and the first and second output test pads CO1 and CO2 of the pad area PD through the display pogo pads EP, the first and second touch pogo pads ETP1 and ETP2, the first and second input test pogo pads EP1 and EP2, and the first and second output test pogo pads EO1 and EO2.

The test touch driver circuit 400 may transmit test signals to the first and second input test pads CP1 and CP2 and the first and second test signal transmission lines CL1 and CL2 through the first and second input test pogo pads EP1 and EP2. In addition, it is possible to detect compression deviations between the first input test pad CP1 and the first input test pogo pad EP1, and between the second input test pad CP2 and the second input test pogo pad EP2 based on the change in the amount of current of the test signals input to the first and second output test pogo pads EO1 and EO2, respectively. In this manner, the test touch driver circuit 400 can correct and compensate for the touch data ETA1_Data of the first area and the touch data ETA2_Data of the second area differently so that they correspond to the compression deviations between the first input test pad CP1 and the first input test pogo pad EP1 and the compression deviations between the second input test pad CP2 and the second input test pogo pad EP2. The corrected touch data items 1_TData and 2_TData may be transmitted to an external test monitoring apparatus or the like. The cause of defects, such as a touch data defect and a communication defect, can be identified from analysis results of the corrected touch data items when a defect is detected in the external test monitoring apparatus.

While the present invention has been described with reference to the embodiments thereof, it will be understood by those of ordinary skill in the art that various changes in form and detail may be made thereto without departing from the spirit and scope of the present invention.

What is claimed is:

1. A touch testing apparatus comprising:
a pogo pad area comprising input and output test pogo pads respectively connected to input and output test pads disposed in a pad area of a touch detection module;
a test touch driver circuit configured to detect compression deviations between the input test pad and the input test pogo pad and between the output test pad and the output test pogo pad, and to correct touch data of the touch detection module based on the detected compression deviations; and
a test board on which the test touch driver circuit is mounted, wherein the test board is configured to electrically connect the test touch driver circuit with the input and output test pogo pads.

2. The apparatus of claim 1, wherein the pogo pad area comprises:
a display pogo area corresponding to a display pad area of the pad area;
a first touch pogo area corresponding to a first touch pad area of the pad area;
a second touch pogo area corresponding to a second touch pad area of the pad area;
a first input pogo area corresponding to a first test pad area of the pad area; and
a first output pogo area corresponding to a second test pad area of the pad area.

3. The apparatus of claim 2, wherein the display pogo area comprises display pogo pads connected to display pads disposed in the display pad area, respectively,
wherein the first touch pogo area comprises first touch pogo pads in contact with first touch pads disposed in the first touch pad area, respectively,
wherein the second touch pogo area comprises second touch pogo pads connected to second touch pads disposed in the second touch pad area,
wherein the first input pogo area comprises a first input test pogo pad connected to a first input test pad disposed in the first test pad area, and
wherein the first output pogo area comprises a first output test pogo pad connected to a first output test pad disposed in the second test pad area.

4. The apparatus of claim 3, wherein the test touch driver circuit is electrically connected to the display pads, the first and second touch pads, and the first input test and first output test pads of the pad area through the display pogo pads, the first and second touch pogo pads, and the first input and first output test pogo pads.

5. The apparatus of claim 4, wherein the test touch driver circuit is configured to supply a touch driving signal to the first touch pads and driving electrodes of the touch detection module through the first touch pogo pads, and to supply a test signal to the first input test pad, a test signal transmission line, and the first output test pad disposed on the touch detection module through the first input test pogo pad.

6. The apparatus of claim 5, wherein the test touch driver circuit is configured to generate the touch data by measuring a charge in an amount of charges stored in each of touch nodes of the touch detection module through the second touch pogo pads, to detect compression deviations between the first input test pad and the first input test pogo pad and between the first output test pad and the first output test pogo pads according to a change in an amount of current of the test signal input through the first output test pogo pad, and to correct the touch data by using compensation data corresponding to the detected compression deviations.

7. The apparatus of claim 4, wherein the test touch driver circuit comprises:
a driving signal output circuit configured to supply a touch driving signal to the first touch pads through the first touch pogo pads, and to supply a test signal to the first input test pad through the first input test pogo pad;
a sensing circuit configured to sense a charge in an amount of charges stored in each of touch nodes of the touch detection module through the second touch pogo pads and to detect the test signal through the first output test pogo pad;
an analog-to-digital converter configured to convert a sensing voltage, which is according to a change in an amount of charges output from the sensing circuit, into digital data to generate the touch data;
a current detector configured to detect an amount of current of the test signal received from the sensing circuit;
a compression deviation detector configured to calculate a resistance value according to a difference in current values by comparing a predetermined reference current value with the amount of detected current value of the test signal;
a compensation data storage configured to output compensation data corresponding to the resistance value; and
a data compensator configured to correct the touch data by calculating the touch data with the compensation data.

8. The apparatus of claim 2, wherein the display pogo area comprises display pogo pads connected to the display pads disposed in the display pad area, respectively,
wherein the first touch pogo area comprises first touch pogo pads and second touch pogo pads, wherein the first touch pogo pads are connected to first touch pads of the first touch pad area, wherein the second touch pogo pads are connected to second touch pads, wherein the second touch pogo area comprises first touch pogo pads and second touch pogo pads, wherein the first touch pogo pads are connected to the first touch pads of the second touch pad area, wherein the second touch pogo pads are connected to the second touch pads, wherein the first input pogo area comprises a first input test pogo pad connected to a first input test pad disposed in the first test pad area, and wherein the first output pogo area comprises a first output test pogo pad connected to a first output test pad disposed in the second test pad area.

9. The apparatus of claim 8, wherein the test touch driver circuit is configured to supply a touch driving signal to the first touch pads and driving electrodes of the touch detection module through the first touch pogo pads separately disposed in the first and second touch pogo areas, and is configured to supply a test signal to the first input test pad, a test signal transmission line and the first output test pad of the touch detection module through the first input test pogo pad.

10. The apparatus of claim 9, wherein the test touch driver circuit is configured to sense and amplify changes in amounts of charges stored in touch nodes that are output separately from the second touch pogo pads of the first touch pogo area and the second touch pogo pads of the second touch pogo area, and to sort sensing voltages according to the changes in the amounts of charges into the first and second touch pogo areas and to convert them into touch data for the first and second touch pogo areas separately.

11. The apparatus of claim 10, wherein the test touch driver circuit is configured to compare an amount of detected current according to the test signal of the first input test pogo pad with a reference current value, to compare an amount of detected current according to the test signal of the first output test pogo pad with the reference current value, to calculate first and second compensation data based on first and second resistance values according to a difference in the compared current values, and to correct the touch data for the different first and second areas by calculating the first and second compensation data on the touch data of the first and second areas divided into the first and second touch pogo areas separately.

12. The apparatus of claim 8, wherein the first input pogo area comprises first and second input test pogo pads respectively connected to first and second input test pads disposed in the first test pad area, and wherein the first output pogo area comprises first and second output test pogo pads respectively connected to first and second output test pads disposed in the second test pad area.

13. The apparatus of claim 12, wherein the test touch driver circuit is configured to supply a test signal to the first and second input test pads and first and second test signal transmission lines of the touch detection module through the first and second input test pogo pads, and to detect compression deviations between the first input test pad and the first input test pogo pad and between the second input test pad and the second input test pogo pad, and compression deviations between the first output test pad and the first output test pogo pad and between the second output test pad and the second output test pogo pad according to a change in an amount of current of the test signal input to the first and second output test pogo pads.

14. The apparatus of claim 2, wherein the first input pogo area comprises a first input test pogo pad and a first output test pogo pad connected to a first input test pad and a first output test pad disposed in the first test pad area, respectively, and wherein the first output pogo area comprises a second input test pogo pad and a second output test pogo pad connected to a second input test pad and a second output test pad disposed in the second test pad area, respectively.

15. The apparatus of claim 14, wherein the test touch driver circuit is configured to supply a test signal to the first and second input test pads and first and second test signal transmission lines through first and second input test pogo pads separately disposed in the first input and first output pogo areas, respectively, and to detect compression deviations between the first input test pad and the first input test pogo pad and compression deviations between the second input test pad and the second input test pogo pad according to a change in an amount of current of the test signal respectively input to the first and second output test pogo pads separately disposed in the first input and first output pogo areas, respectively.

16. A method for testing a touch detection module, the method comprising:
connecting first input and first output test pogo pads included in a pogo pad area with first input and first output test pads disposed in a pad area of a touch detection module, respectively;
supplying a test signal to the first input test pad and a first test signal transmission line of the touch detection module through the first input test pogo pad, wherein the first test signal transmission line is connected to the first input test pad;
detecting compression deviations between the first input test pad and the first input test pogo pad and between the first output test pad and the first output test pogo pad based on a change in an amount of current of the test signal output through the first output test pogo pad; and
correcting touch data of the touch detection module using compensation data items corresponding to the detected compression deviations.

17. The method of claim 16, wherein the connecting the first input and first output test pogo pads with the first input and first output test pads, respectively, comprises:
connecting display pogo pads disposed in a display pogo area of the pogo pad area with display pads disposed in a display pad area of the pad area;
connecting first touch pogo pads disposed in a first touch pogo area of the pogo pad area with first touch pads disposed in a first touch pad area of the pad area;
connecting second touch pogo pads disposed in a second touch pogo area of the pogo pad area with second touch pads disposed in a second touch pad area of the pad area;
connecting the first input test pogo pad disposed in a first input pogo area of the pogo pad area with the first input test pad disposed in a first test pad area of the pad area; and
connecting the first output test pogo pad disposed in a first output pogo area of the pogo pad area with the first output test pad disposed in a second test pad area of the pad area.

18. The method of claim 17, wherein the correcting touch data of the touch detection module comprises:
measuring a change in an amount of charges stored in each of touch nodes of the touch detection module through the second touch pogo pads to generate touch data items according to the change in the amount of charges stored in each of the touch nodes;
detecting compression deviations between the first input test pad and the first input test pogo pad and between the first output test pad and the first output test pogo pad according to a change in an amount of current of the test signal output to the first output test pogo pad; and
correcting the touch data items by calculating the touch data and the compensation data items corresponding to the detected compression deviations.

19. The method of claim 17, wherein the correcting the touch data of the touch detection module comprises:
supplying a touch driving signal to the first touch pads through the first touch pogo pads;
detecting a change in an amount of charges stored in each of touch nodes of the touch detection module through the second touch pogo pads to convert a sensing voltage according to the change in the amount of charges into the touch data;
detecting an amount of current of the test signal by receiving the test signal through the first output test pogo pad;
comparing a predetermined reference current value with an amount of detected current of the test signal to calculate a resistance value according to a difference in the current values; and
compensating for the touch data by calculating the touch data and predetermined compensation data corresponding to the resistance value.

20. The method of claim 19, wherein the compensation data is set to data values having a predetermined size according to predetermined experimental values, or set to a predetermined weight value or predetermined threshold value.

21. The method of claim 20, wherein the correcting the touch data of the touch detection module comprises correcting the touch data by adding or subtracting the compensation data to or from the touch data, or correcting the touch data by multiplying the touch data by the weight value or the threshold value.

22. The method of claim 16, wherein the connecting the first input and first output test pogo pads with the first input and first output test pads, respectively, comprises:
   connecting display pogo pads disposed in a display pogo area of the pogo pad area with display pads disposed in a display pad area of the pad area;
   connecting first touch pogo pads and second touch pogo pads disposed in a first touch pogo area of the pogo pad area with first touch pads and second touch pads disposed in a first touch pad area of the pad area;
   connecting first touch pogo pads and second touch pogo pads disposed in a second touch pogo area of the pogo pad area with first touch pads and second touch pads disposed in a second touch pad area of the pad area;
   connecting the first input test pogo pad disposed in a first input pogo area of the pogo pad area with the first input test pad disposed in a first test pad area of the pad area; and
   connecting the first output test pogo pad disposed in a first output pogo area of the pogo pad area with the first output test pad disposed in a second test pad area of the pad area.

23. The method of claim 22, wherein the correcting the touch data of the touch detection module comprises:
   detecting changes in amounts of charges stored in touch nodes that are separately output from the second touch pogo pads in the first touch pogo area and the second touch pogo pads in the second touch pogo area;
   converting sensing voltages according to the changes in the amounts of charges into touch data, of the first and second touch pogo areas, by sorting them into the first and second touch pogo areas;
   comparing each of an amount of current according to a test signal of the first input test pogo pad and an amount of detected current according to a test signal of the first output test pogo pad with a reference current value to calculate first and second compensation data based on analysis results; and
   calculating the first and second compensation data for the touch data for the first and second touch pogo areas, respectively, to correct the touch data for the first and second touch pogo areas.

24. The method of claim 16, wherein the connecting the first input and first output test pogo pads with the first input and first output test pads, respectively, comprises:
   connecting display pogo pads disposed in a display pogo area of the pogo pad area with display pads disposed in a display pad area of the pad area;
   connecting first touch pogo pads disposed in a first touch pogo area of the pogo pad area with first touch pads disposed in a first touch pad area of the pad area;
   connecting second touch pogo pads disposed in a second touch pogo area of the pogo pad area with second touch pads disposed in a second touch pad area of the pad area;
   connecting the first input test pogo pad and a second input test pogo pad disposed in a first input pogo area of the pogo pad area with the first input test pad and a second input test pad disposed in a first test pad area of the pad area; and
   connecting the first output test pogo pad and a second output test pogo pad disposed in a first output pogo area of the pogo pad area with the first output test pad and a second output test pad disposed in a second test pad area of the pad area.

25. The method of claim 24, wherein the detecting the compression deviations between the first input test pad and the first input test pogo pad and between the first output test pad and the first output test pogo pad comprises:
   supplying the test signal to the first and second input test pads of the touch detection module and the first test signal transmission line and a second test signal transmission line through the first and second input test pogo pads; and
   detecting compression deviations between the first input test pad and the first input test pogo pad and between the second input test pad the second input test pogo pad and compression deviations between the first output test pad and the first output test pogo pad and between the second output test pad and the second output test pogo pad according to a change in an amount of current of the test signal input to the first and second output test pogo pads.

26. The method of claim 16, wherein the connecting the first input and first output test pogo pads with the first input and first output test pads, respectively, comprises:
   connecting display pogo pads disposed in a display pogo area of the pogo pad area with display pads disposed in a display pad area of the pad area;
   connecting first touch pogo pads disposed in a first touch pogo area of the pogo pad area with first touch pads disposed in a first touch pad area of the pad area;
   connecting second touch pogo pads disposed in a second touch pogo area of the pogo pad area with second touch pads disposed in a second touch pad area of the pad area;
   connecting the first input test pogo pad and the first output test pogo pad disposed in a first input pogo area of the pogo pad area to the first input test pad and the first output test pad disposed in a first test pad area of the pad area;
   connecting a second input test pogo pad and a second output test pogo pad disposed in a first output pogo area of the pogo pad area to a second input test pad and a second output test pad disposed in a second test pad area of the pad area.

27. The method of claim 26, wherein the detecting the compression deviations between the first input test pad and the first input test pogo pad and between the first output test pad and the first output test pogo pad comprises:
   supplying the test signal to the first and second input test pads and the first test signal transmission line and a second test signal transmission line through first and second input test pogo pads separately disposed in the first input and first output pogo areas, respectively; and
   detecting compression deviations between the first input test pad and the first input test pogo pad and compression deviations between the second input test pad and the second input test pogo pad according to a change in an amount of current of the test signal respectively input to the first and second output test pogo pads separately disposed in the first input and first output pogo areas, respectively.

* * * * *